United States Patent
Lee

(10) Patent No.: US 9,362,917 B1
(45) Date of Patent: Jun. 7, 2016

(54) LOW VOLTAGE DIFFERENTIAL SIGNALING (LVDS) DRIVING CIRCUIT

(71) Applicant: VIA Alliance Semiconductor Co., Ltd., Shanghai (CN)

(72) Inventor: Yeong-Sheng Lee, Fremont, CA (US)

(73) Assignee: VIA ALLIANCE SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 14/731,930

(22) Filed: Jun. 5, 2015

Related U.S. Application Data

(63) Continuation-in-part of application No. 14/551,280, filed on Nov. 24, 2014.

(51) Int. Cl.
  *H03K 3/00* (2006.01)
  *H03K 19/0185* (2006.01)
  *H03K 19/21* (2006.01)

(52) U.S. Cl.
  CPC ........ *H03K 19/018514* (2013.01); *H03K 19/21* (2013.01)

(58) Field of Classification Search
  CPC .............................................. H03K 19/018514
  See application file for complete search history.

(56) References Cited

U.S. PATENT DOCUMENTS 6,281,715 B1 * 8/2001 DeClue .......... H03K 19/018525
                                                      327/108
2008/0054953 A1    3/2008 Chen et al.

OTHER PUBLICATIONS

Non-Final Office Action dated Nov. 16, 2015, issued in U.S. Appl. No. 14/551,280.

* cited by examiner

*Primary Examiner* — Daniel Puentes
(74) *Attorney, Agent, or Firm* — McClure, Qualey & Rodack, LLP

(57) ABSTRACT

An LVDS (Low Voltage Differential Signaling) driving circuit includes a first transistor, a second transistor, a third transistor, a fourth transistor, a first resistor, a second resistor, and a bias driver. The first transistor is coupled between a supply voltage and a first node. The second transistor is coupled between the supply voltage and a second node. The third transistor is coupled between the first node and a ground voltage. The fourth transistor is coupled between the second node and the ground voltage. The first resistor is coupled between the first node and a third node. The second resistor is coupled between the second node and the third node. The bias driver generates bias signals for controlling the first, second, third, and fourth transistors according to a data signal.

19 Claims, 21 Drawing Sheets

LOW VOLTAGE DIFFERENTIAL SIGNALING (LVDS) DRIVING CIRCUIT

CROSS REFERENCE TO RELATED APPLICATIONS

This application is a Continuation-In-Part of application Ser. No. 14/551,280, filed on Nov. 24, 2014, the entirety of which is incorporated by reference herein.

BACKGROUND OF THE INVENTION

1. Field of the Invention

The disclosure generally relates to an LVDS (Low Voltage Differential Signaling) driving circuit, and more particularly, to an LVDS driving circuit with a simplified circuit structure and a high operating speed.

2. Description of the Related Art

Differential signaling circuits are very popular, being used in data transmission nowadays, including LVDS (Low Voltage Differential Signaling), HDMI (High-Definition Multimedia Interface), and USB (Universal Serial Bus), etc. Differential signaling circuits have power saving and noise rejection advantages. However, conventional differential signaling circuits require bias currents which are driven by current sources. With the progress in manufacturing technology, the supply voltage of circuits has gradually become lower. As a result, the current sources may have insufficient head room, and the output range of the differential signaling circuits may be very limited.

BRIEF SUMMARY OF THE INVENTION

In a preferred embodiment, the invention is directed to an LVDS (Low Voltage Differential Signaling) driving circuit generating a differential signal at a first node and a second node according to a data signal, including a first transistor, a second transistor, a third transistor, and a fourth transistor. The first transistor includes a first terminal coupled to a supply voltage and a second terminal coupled to the first node. The first transistor and a first driver form a first current mirror when the data signal is at a high logic level, but they do not form a first current mirror when the data signal is at a low logic level. When a first current mirror is formed, the current that passes through the first transistor when a XOR result of the data signal and a delayed data signal is logical high is higher than the current passing through the first transistor when the XOR result of the data signal and the delayed data signal is logical low. The second transistor includes a first terminal coupled to the supply voltage and a second terminal coupled to the second node. The second transistor and a second driver form a second current mirror when the data signal is at the low logic level, but they do not form a second current mirror when the data signal is at the high logic level. When a second current mirror is formed, the current passing through the second transistor when the XOR result of the data signal and the delayed data signal is logical high is higher than the current that passes through the second transistor when the XOR result of the data signal and the delayed data signal is logical low. The third transistor includes a first terminal coupled to a ground voltage and a second terminal coupled to the first node. The third transistor and a third driver form a third current mirror when the data signal is at the low logic level. The third transistor and the third driver do not form a third current mirror when the data signal is at the high logic level. When the third current mirror is formed, a current passing through the third transistor when the XOR result of the data signal and the delayed data signal is logical high is higher than the current passing through the third transistor when the XOR result of the data signal and the delayed data signal is logical low. The fourth transistor includes a first terminal coupled to the ground voltage and a second terminal coupled to the second node. The fourth transistor, along with a fourth driver, form a fourth current mirror when the data signal is at the high logic level, but they do not form such a fourth current mirror when the data signal is at the low logic level. When a fourth current mirror is formed, the current that passes through the fourth transistor when the XOR result of the data signal and the delayed data signal is logical high is higher than the current passing through the fourth transistor when the XOR result of the data signal and the delayed data signal is logical low. The delayed data signal is generated by delaying the data signal with a time delay.

In some embodiments, each of the first driver and the second driver includes: a fifth transistor, wherein the fifth transistor has a control terminal coupled to a fourth node, a first terminal coupled to the supply voltage, and a second terminal coupled to the fourth node, wherein the fourth node has a first constant bias voltage; a first current sink, drawing a first current from the fourth node; a second current sink, drawing a second current from the fourth node when a XOR signal is logical high and not drawing the second current from the fourth node when the XOR signal is logical low, wherein the XOR signal is generated according to the XOR result of the data signal and the delayed data signal; and a first operational amplifier, wherein the first operational amplifier has a negative input terminal coupled to the fourth node, a positive input terminal coupled to a first driving node, and an output terminal coupled to the positive input terminal according to the data signal, wherein the first driving node of the first driver is coupled to a control terminal of the first transistor and the first driving node of the second driver is coupled to a control terminal of the second transistor.

In some embodiments, each of the first driver and the second driver further includes: a first switch, wherein the first switch has a first terminal coupled to the output terminal of the first operational amplifier, and a second terminal; a second switch, wherein the second switch has a first terminal coupled to the second terminal of the first switch, and a second terminal coupled to the ground voltage; a fifth switch, wherein the fifth switch has a first terminal coupled to the fourth node, and a second terminal coupled to the second current sink, wherein the fifth switch is on when the XOR signal is logical high and off when the XOR signal is logical low; and a sixth transistor, wherein the sixth transistor has a control terminal coupled to the second terminal of the first switch, a first terminal coupled to the supply voltage, and a second terminal coupled to the first driving node.

In some embodiments, in the first driver, the first switch is on and the second switch is off when the data signal is at the low logic level, and the first switch is off and the second switch is on when the data signal is at the high logic level, and wherein in the second driver, the first switch is on and the second switch is off when the data signal is at the high logic level, and the first switch is off and the second switch is on when the data signal is at the low logic level.

In some embodiments, the second current sink is a variable current sink, and the second current is adjusted according to a voltage difference between a voltage at the first node and a voltage at the second node.

In some embodiments, the LVDS driving circuit further includes a capacitor, having a first terminal receiving the voltage difference between the voltage at the first node and the voltage at the second node, and a second terminal; a seventh switch, wherein the seventh switch has a first terminal coupled to the second terminal of the capacitor, and a second terminal coupled to the ground voltage, wherein the seventh switch is on when a transition edge signal is logical high and off when the transition edge signal is logical low; an eighth switch, wherein the eighth switch has a first terminal coupled to the second terminal of the capacitor, and a second terminal, wherein the eighth switch is on when a delayed transition edge signal is logical high and off when the delayed transition edge signal is logical low, wherein the delayed transition edge signal is generated by delaying the transition edge signal by the time delay; and a third operational amplifier, wherein the third operational amplifier has a positive input terminal coupled to the second terminal of the eighth switch, a negative input terminal coupled to the ground voltage, and an output terminal coupled to the second current source according to the delayed transition edge signal.

In some embodiments, the negative input terminal of the third operational amplifier is coupled to the ground voltage via a reference voltage source.

In some embodiments, the third operational amplifier has an input offset voltage between the negative input terminal and the positive input terminal.

In some embodiments, the transition edge signal is generated according to an AND result of the data signal and an inverse of the delayed data signal.

In some embodiments, the transition edge signal is generated according to an AND result of the delayed data signal and an inverse of the data signal.

In some embodiments, each of the third driver and the fourth driver includes: a seventh transistor, wherein the seventh transistor has a control terminal coupled to a sixth node, a first terminal coupled to the ground voltage, and a second terminal coupled to the sixth node, wherein the sixth node has a second constant bias voltage; a first current source, supplying a first current to the sixth node; a second current source, supplying a second current to the sixth node when a XOR signal is logical high and not supplying the second current to the sixth node when the XOR signal is logical low, wherein the XOR signal is generated according to the XOR result of the data signal and the delayed data signal; and a second operational amplifier, wherein the second operational amplifier has a negative input terminal coupled to the sixth node, a positive input terminal coupled to a second driving node, and an output terminal coupled to the positive input terminal according to the data signal, wherein the second driving node of the third driver is coupled to a control terminal of the third transistor and the second driving node of the fourth driver is coupled to a control terminal of the fourth transistor.

In some embodiments, each of the third driver and the fourth driver further includes: a fourth switch, wherein the fourth switch has a first terminal coupled to the output terminal of the second operational amplifier, and a second terminal; a third switch, wherein the third switch has a first terminal coupled to the second terminal of the fourth switch, and a second terminal coupled to the supply voltage; a sixth switch, wherein the sixth switch has a first terminal coupled to the sixth node, and a second terminal coupled to the second current source, wherein the sixth switch is on when the XOR signal is logical high and off when the XOR signal is logical low; and an eighth transistor, wherein the eighth transistor has a control terminal coupled to the second terminal of the fourth switch, a first terminal coupled to the ground voltage, and a second terminal coupled to the second driving node.

In some embodiments, in the third driver, the third switch is on and the fourth switch is off when the data signal is at the high logic level, and the third switch is off and the fourth switch is on when the data signal is at the low logic level, and wherein in the fourth driver, the third switch is on and the fourth switch is off when the data signal is at the low logic level, and the third switch is off and the fourth switch is on when the data signal is at the high logic level.

In some embodiments, the second current source is a variable current source, and the second current is adjusted according to a voltage difference between a voltage at the first node and a voltage at the second node.

In some embodiments, the LVDS driving circuit further includes a capacitor, having a first terminal receiving the voltage difference between the voltage at the first node and the voltage at the second node, and a second terminal; a seventh switch, wherein the seventh switch has a first terminal coupled to the second terminal of the capacitor, and a second terminal coupled to the ground voltage, wherein the seventh switch is on when a transition edge signal is logical high and off when the transition edge signal is logical low; an eighth switch, wherein the eighth switch has a first terminal coupled to the second terminal of the capacitor, and a second terminal, wherein the eighth switch is on when a delayed transition edge signal is logical high and off when the delayed transition edge signal is logical low, wherein the delayed transition edge signal is generated by delaying the transition edge signal by the time delay; and a third operational amplifier, wherein the third operational amplifier has a positive input terminal coupled to the second terminal of the eighth switch, a negative input terminal coupled to the ground voltage, and an output terminal coupled to the second current source according to the delayed transition edge signal.

In some embodiments, the negative input terminal of the third operational amplifier is coupled to the ground voltage via a reference voltage source.

In some embodiments, the third operational amplifier has an input offset voltage between the negative input terminal and the positive input terminal.

In some embodiments, the transition edge signal is generated according to an AND result of the data signal and an inverse of the delayed data signal.

In some embodiments, the transition edge signal is generated according to an AND result of the delayed data signal and an inverse of the data signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows.

Figure 1:
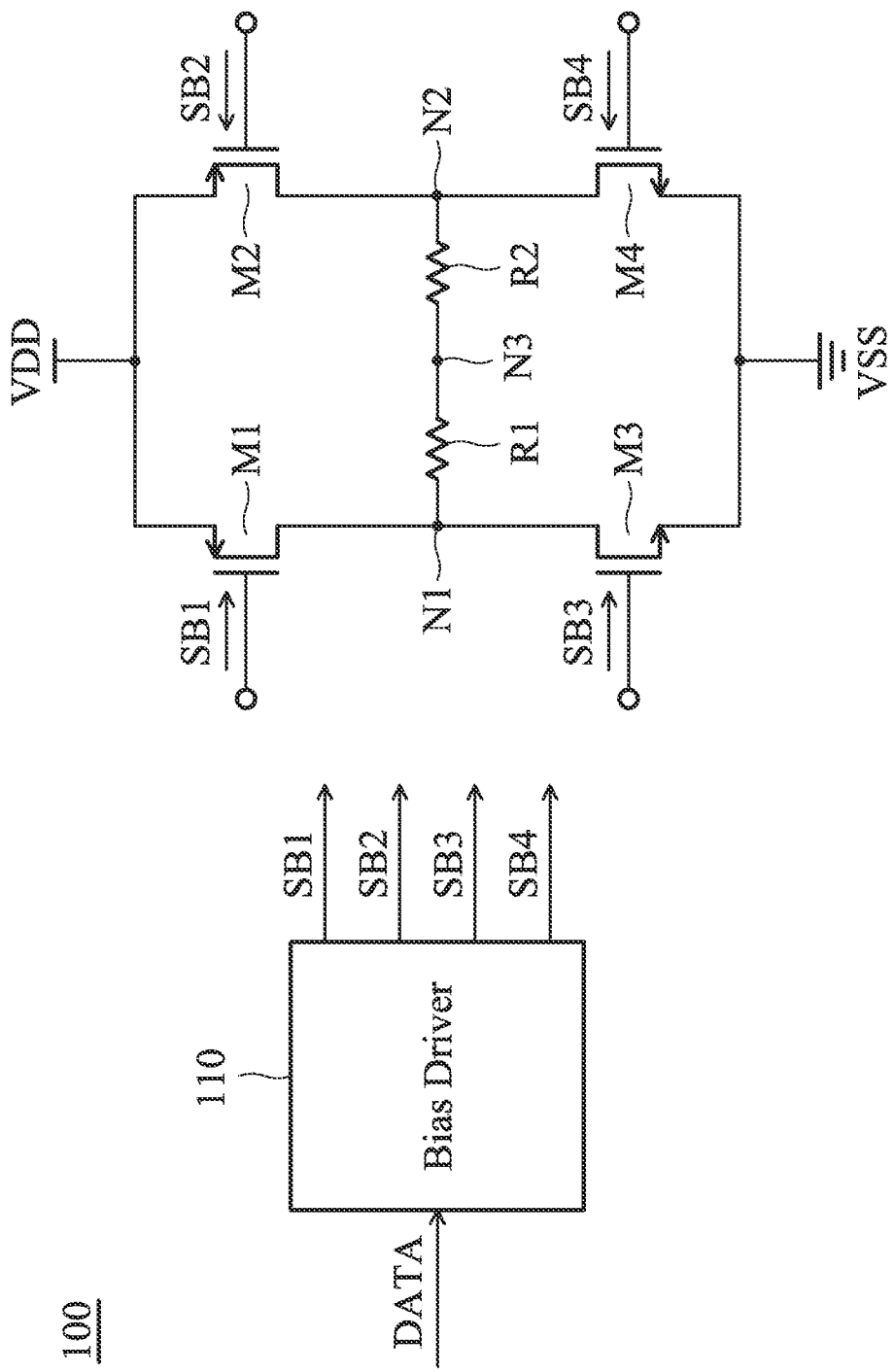
FIG. 1 is a diagram of an LVDS (Low Voltage Differential Signaling) driving circuit according to an embodiment of the invention.

FIG. 1 is a diagram of an LVDS (Low Voltage Differential Signaling) driving circuit 100 according to an embodiment of the invention. The LVDS driving circuit 100 includes a first transistor M1, a second transistor M2, a third transistor M3, a fourth transistor M4, a first resistor R1, a second resistor R2, and a bias driver 110. The bias driver 110 generates a first bias signal SB1, a second bias signal SB2, a third bias signal SB3, and a fourth bias signal SB4 for controlling the first transistor M1, the second transistor M2, the third transistor M3, and the fourth transistor M4, respectively, according to a data signal DATA. The data signal DATA may be a digital signal. In some embodiments, the first transistor M1 and the second transistor M2 are PMOS transistors (P-type Metal Oxide Semiconductor Field Effect Transistor), and the third transistor M3 and the fourth transistor M4 are NMOS transistors (N-type Metal Oxide Semiconductor Field Effect Transistor). The first transistor M1 has a control terminal for receiving the first bias signal SB1, a first terminal coupled to a supply voltage VDD (e.g., 1V), and a second terminal coupled to a first node N1. The second transistor M2 has a control terminal for receiving the second bias signal SB2, a first terminal coupled to the supply voltage VDD, and a second terminal coupled to a second node N2. The third transistor M3 has a control terminal for receiving the third bias signal SB3, a first terminal coupled to a ground voltage VSS (e.g., 0V), and a second terminal coupled to the first node N1. The fourth transistor M4 has a control terminal for receiving the fourth bias signal SB4, a first terminal coupled to the ground voltage VSS, and a second terminal coupled to the second node N2. The first resistor R1 has a first terminal coupled to the first node N1, and a second terminal coupled to a third node N3. The second resistor R2 has a first terminal coupled to the second node N2, and a second terminal coupled to the third node N3. The first node N1 may be considered a positive output terminal of the LVDS driving circuit 110. The second node N2 may be considered a negative output terminal of the LVDS driving circuit 110. The third node N3 may be considered a common node. When the first transistor M1 and the fourth transistor M4 are turned on and the second transistor M2 and the third transistor M3 are turned off, the voltage at the first node N1 is charged up, and the voltage at the second node N2 is discharged down. When the second transistor M2 and the third transistor M3 are turned on and the first transistor M1 and the fourth transistor M4 are turned off, the voltage at the first node N1 is discharged down, and the voltage at the second node N2 is charged up. That is, in addition to being switches, the first transistor M1 and the second transistor M2 are used as current sources to selectively supply currents to the first node N1 and the second node N2, and the third transistor M3 and the fourth transistor M4 are used as current sinks to selectively draw currents from the first node N1 and the second node N2. In the invention, since the necessary current sources and current sink are replaced or combined with the switch transistors M1 to M4, the proposed LVDS driving circuit 100 has fewer elements and a lower manufacturing cost. Furthermore, the output range of the LVDS driving circuit 100 is increased because it is no longer limited by the head room of the current sources and current sinks. As a result, a designer can have more freedom to apply the LVDS driving circuit 100 to a variety of systems and circuits.

The bias driver 110 may include a first driver 111, a second driver 112, a third driver 113, and a fourth driver 114, which will be discussed in the following embodiments. It should be understood that these embodiments are just exemplary, and shall not restrict limitations of the invention.

Figure 2A:
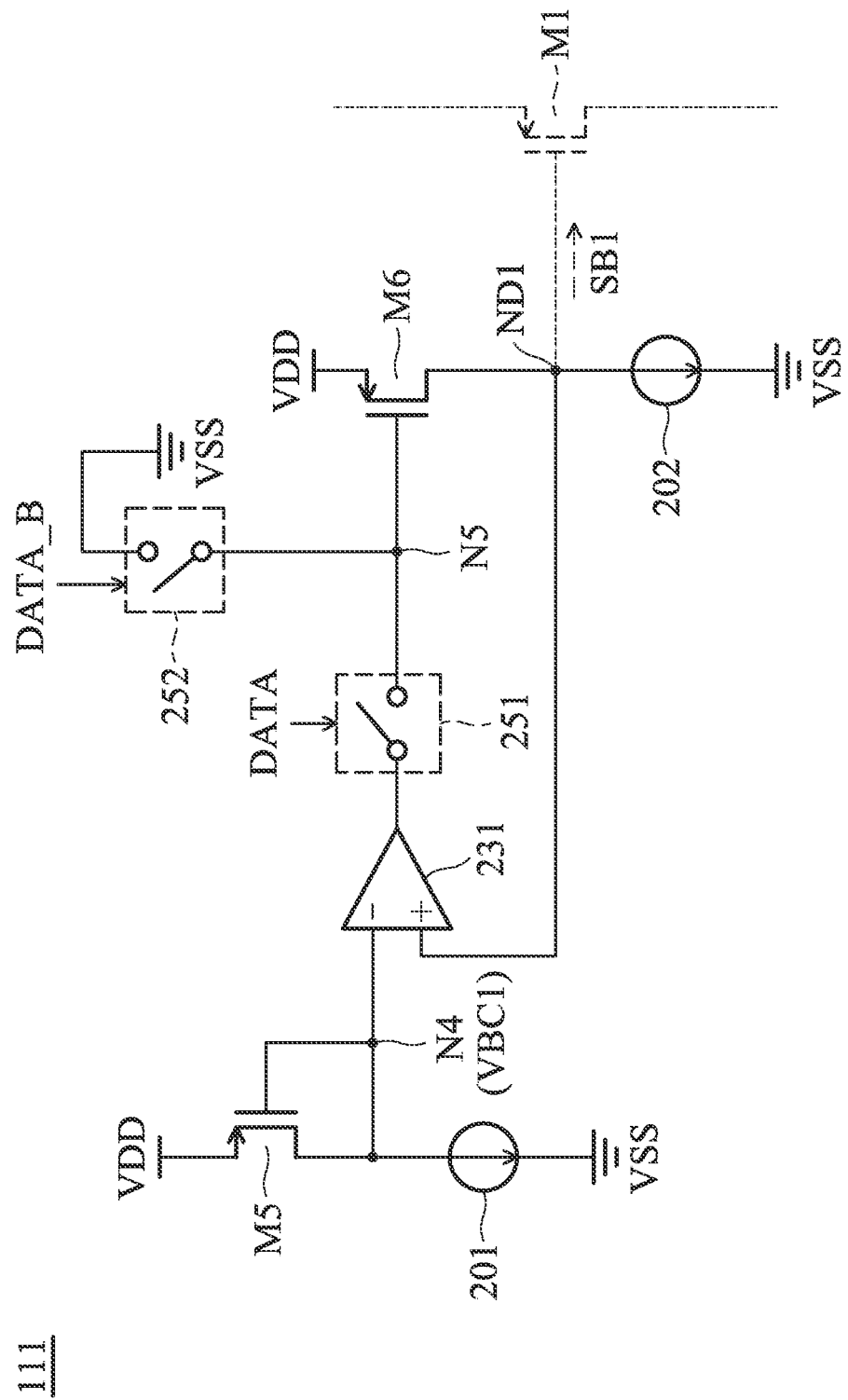
FIG. 2A is a diagram of a first driver according to an embodiment of the invention.

FIG. 2A is a diagram of the first driver 111 according to an embodiment of the invention. In the embodiment of FIG. 2A, the first driver 111 includes a first current sink 201, a second current sink 202, a first operational amplifier 231, a first switch 251, a second switch 252, a fifth transistor M5, and a sixth transistor M6. In some embodiments, the fifth transistor M5 and the sixth transistor M6 are PMOS transistors. The fifth transistor M5 has a control terminal coupled to a fourth node N4, a first terminal coupled to the supply voltage VDD, and a second terminal coupled to the fourth node N4. The first current sink 201 draws a first current (e.g., 1 mA) from the fourth node N4. Since the current to the first current sink 201 is constant, the fourth node N4 has a first constant bias voltage VBC1 (e.g., 0.7V). The first operational amplifier 231 has a negative input terminal coupled to the fourth node N4, a positive input terminal coupled to a first driving node ND1, and an output terminal. The first switch 251 has a first terminal coupled to the output terminal of the first operational amplifier 231, and a second terminal coupled to a fifth node N5. The second switch 252 has a first terminal coupled to the fifth node N5, and a second terminal coupled to the ground voltage VSS. The first switch 251 is controlled by the data signal DATA, and the second switch 252 is controlled by an inverted data signal DATA_B, which has a reverse logic level of the data signal DATA. In other words, the first switch 251 and the second switch 252 are controlled by complementary signals. If one of them is turned on, the other of them should be turned off. The sixth transistor M6 has a control terminal coupled to the fifth node N5, a first terminal coupled to the supply voltage VDD, and a second terminal coupled to the first driving node ND1. The second current sink 202 draws a current (e.g., 1 mA) from the first driving node ND1. The first driving node ND1 is arranged for outputting the first bias signal SB1 to the control terminal of the first transistor M1 (represented by a dashed line, not a part of the first driver 111). When the data signal DATA is at a low logic level (e.g., a logic 0), the first switch 251 is off and the second switch 252 is on so that the control terminal of the sixth transistor M6 is coupled to the ground voltage VSS, and thus the sixth transistor M6 is turned on and the control terminal of the first transistor M1 is coupled to the supply voltage VDD so that the first transistor M1 is turned off. On the other hand, when the data signal DATA is at a high logic level (e.g., a logic 1), the first switch 251 is on and the second switch 252 is off so that a negative feedback loop is formed around the first operational amplifier 231, and thus the fourth node N4 and the first driving node ND1 are virtually short so that the first transistor M1 and the fifth transistor M5 may form a first current mirror. In one embodiment, the size of the first transistor M1 is about 10 times that of the fifth transistor M5. The first transistor M1 has a greater capability to drive current, and therefore it is used as a current source for supplying a large current (e.g., 10 mA) according to the first current of the first current sink 201. The first driver 111 and the first transistor M1 form a high-speed accurate analog circuit for controlling the voltage at the first node N1 of the LVDS driving circuit 100 according to the data signal DATA.

Figure 2B:
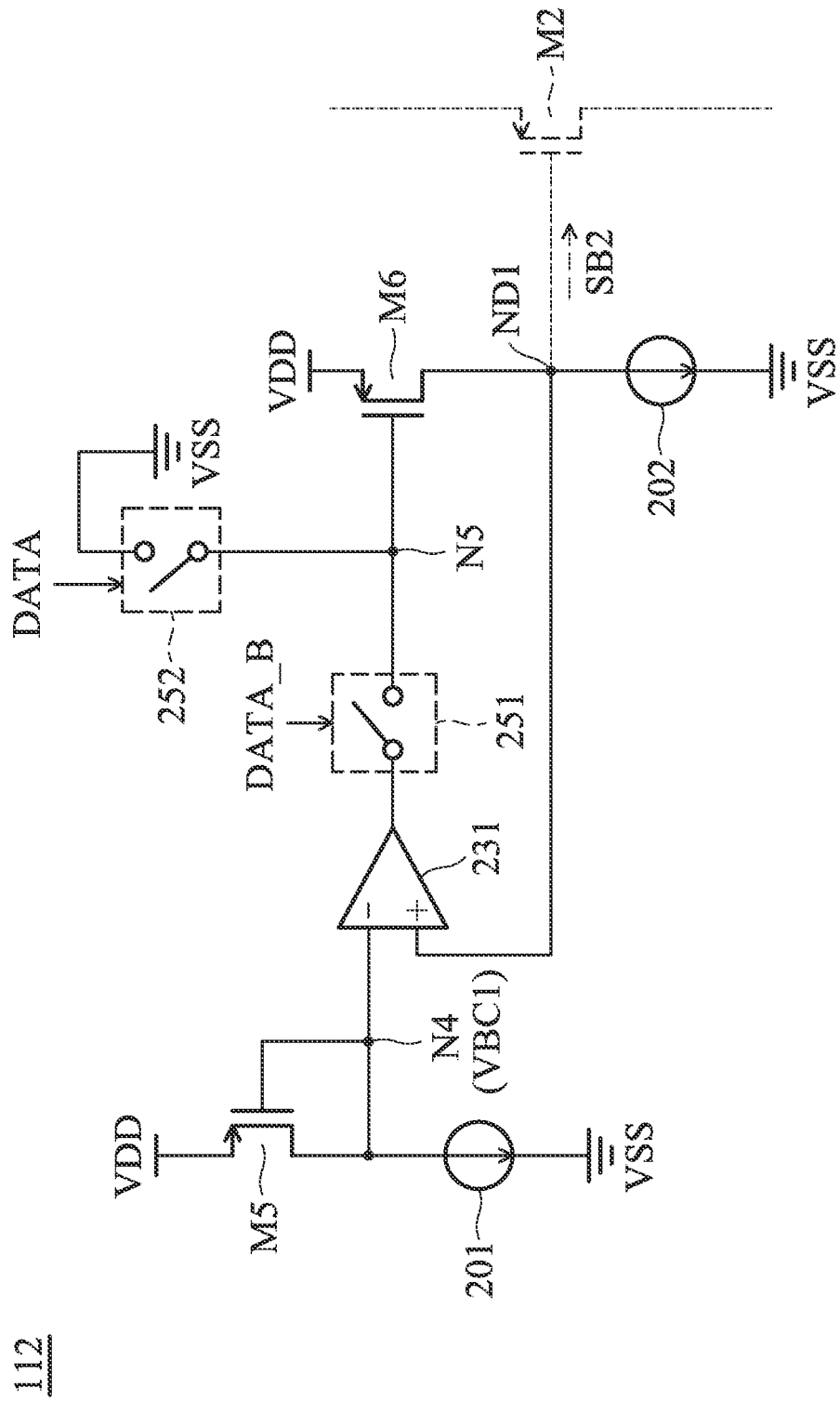
FIG. 2B is a diagram of a second driver according to an embodiment of the invention.

FIG. 2B is a diagram of the second driver 112 according to an embodiment of the invention. The second driver 112 of FIG. 2B is similar to the first driver 111 of FIG. 2A. The difference between them is that in the second driver 112, the first switch 251 is controlled by the inverted data signal DATA_B, the second switch 252 is controlled by the data signal DATA, and the first driving node ND1 is arranged for outputting the second bias signal SB2 to the control terminal of the second transistor M2 (represented by a dashed line, not a part of the second driver 112). It should be understood that the second driver 112 does not share any elements (e.g., the first operational amplifier 231, the fifth transistor M5, etc., which appear in both FIG. 2A and FIG. 2B) with the first driver 111. The same reference numerals of elements are used for readers to understand that the two circuits have similar structures and partially-identical elements. As a matter of fact, every element of FIG. 2B is independent of that of FIG. 2A. When the data signal DATA is at a high logic level (e.g., a logic 1), the first switch 251 is off and the second switch 252 is on so that the control terminal of the sixth transistor M6 is coupled to the ground voltage VSS, and thus the sixth transistor M6 is turned on and the control terminal of the second transistor M2 is coupled to the supply voltage VDD so that the second transistor M2 is turned off. On the other hand, when the data signal DATA is at a low logic level (e.g., a logic 0), the first switch 251 is on and the second switch 252 is off so that a negative feedback loop is formed around the first operational amplifier 231, and thus the fourth node N4 and the first driving node ND1 are virtually short so that the second transistor M2 and the fifth transistor M5 may form a second current mirror. In one embodiment, the size of the second transistor M2 is about 10 times that of the fifth transistor M5. The second transistor M2 has a greater capability to drive current, and therefore it is used as a current source for supplying a large current (e.g., 10 mA) according to the first current of the first current sink 201. The second driver 111 and the second transistor M2 form a high-speed accurate analog circuit for controlling the voltage at the second node N2 of the LVDS driving circuit 100 according to the data signal DATA.

Figure 2C:
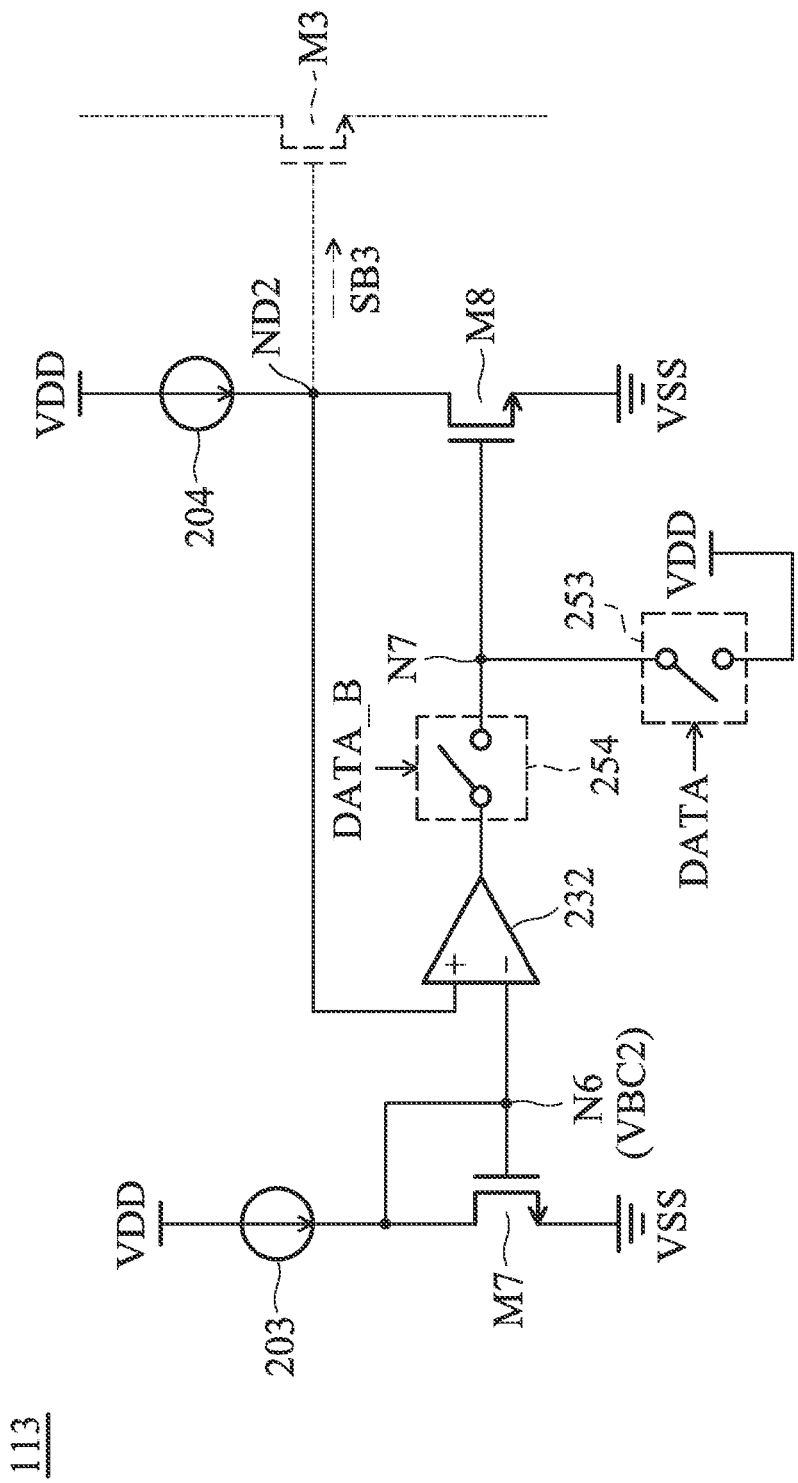
FIG. 2C is a diagram of a third driver according to an embodiment of the invention.

FIG. 2C is a diagram of the third driver 113 according to an embodiment of the invention. In the embodiment of FIG. 2C, the third driver 113 includes a first current source 203, a second current source 204, a second operational amplifier 232, a third switch 253, a fourth switch 254, a seventh transistor M7, and an eighth transistor M8. In some embodiments, the seventh transistor M7 and the eighth transistor M8 are NMOS transistors. The seventh transistor M7 has a control terminal coupled to a sixth node N6, a first terminal coupled to the ground voltage VSS, and a second terminal coupled to the sixth node N6. The first current source 203 supplies a first current (e.g., 1 mA) to the sixth node N6. Since the current from the first current source 203 is constant, the sixth node N6 has a second constant bias voltage VBC2 (e.g., 0.3V). The second operational amplifier 232 has a negative input terminal coupled to the sixth node N6, a positive input terminal coupled to a second driving node ND2, and an output terminal. The third switch 253 has a first terminal coupled to a seventh node N7, and a second terminal coupled to the supply voltage VDD. The fourth switch 254 has a first terminal coupled to the output terminal of the second operational amplifier 232, and a second terminal coupled to the seventh node N7. The third switch 253 is controlled by the data signal DATA, and the fourth switch 254 is controlled by the inverted data signal DATA_B. The eighth transistor M8 has a control terminal coupled to the seventh node N7, a first terminal coupled to the ground voltage VSS, and a second terminal coupled to the second driving node ND2. The second current source 204 supplies a current (e.g., 1 mA) to the second driving node ND2. The second driving node ND2 is arranged for outputting the third bias signal SB3 to the control terminal of the third transistor M3 (represented by a dashed line, not a part of the third driver 113). When the data signal DATA is at a high logic level (e.g., a logic 1), the third switch 253 is on and the fourth switch 254 is off so that the control terminal of the eighth transistor M8 is coupled to the supply voltage VDD, and thus the eighth transistor M8 is turned on and the control terminal of the third transistor M3 is coupled to the ground voltage VSS so that the third transistor M3 is turned off. On the other hand, when the data signal DATA is at a low logic level (e.g., a logic 0), the third switch 253 is off and the fourth switch 254 is on so that a negative feedback loop is formed around the second operational amplifier 232, and thus the sixth node N6 and the second driving node ND2 are virtually short so that the third transistor M3 and the seventh transistor M7 may form a third current mirror. In one embodiment, the size of the third transistor M3 is about 10 times that of the seventh transistor M7. The third transistor M3 has a greater capability to drive current, and therefore it is used as a current sink for drawing a large current (e.g., 10 mA) according to the first current of the first current source 203. The third driver 113 and the third transistor M3 form a high-speed accurate analog circuit for controlling the voltage at the first node N1 of the LVDS driving circuit 100 according to the data signal DATA.

Figure 2D:
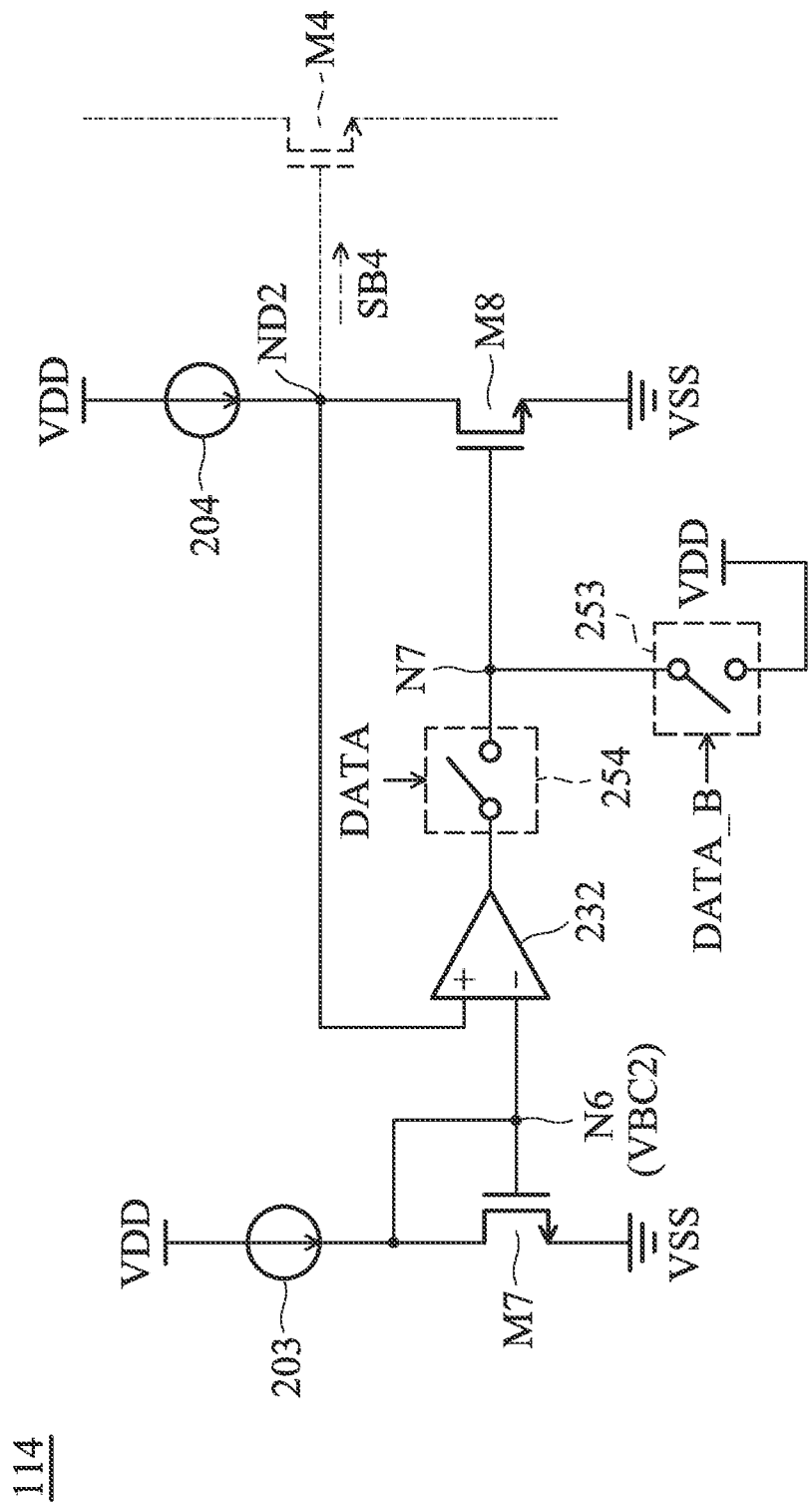
FIG. 2D is a diagram of a fourth driver according to an embodiment of the invention.

FIG. 2D is a diagram of the fourth driver 114 according to an embodiment of the invention. The fourth driver 114 of FIG. 2D is similar to the third driver 113 of FIG. 2C. The difference between them is that in the fourth driver 114, the third switch 253 is controlled by the inverted data signal DATA_B, the fourth switch 254 is controlled by the data signal DATA, and the second driving node ND2 is arranged for outputting the fourth bias signal SB4 to the control terminal of the fourth transistor M4 (represented by a dashed line, not a part of the fourth driver 114). It should be understood that the fourth driver 114 does not share any elements with the third driver 113. Every element of FIG. 2D is independent of that of FIG.

2C. When the data signal DATA is at a low logic level (e.g., a logic 0), the third switch 253 is on and the fourth switch 254 is off so that the control terminal of the eighth transistor M8 is coupled to the supply voltage VDD, and thus the eighth transistor M8 is turned on and the control terminal of the fourth transistor M4 is coupled to the ground voltage VSS so that the fourth transistor M4 is turned off. On the other hand, when the data signal DATA is at a high logic level (e.g., a logic 1), the third switch 253 is off and the fourth switch 254 is on so that a negative feedback loop is formed around the second operational amplifier 232, and thus the sixth node N6 and the second driving node ND2 are virtually short so that the fourth transistor M4 and the seventh transistor M7 may form a fourth current mirror. In one embodiment, the size of the fourth transistor M4 is about 10 times that of the seventh transistor M7. The fourth transistor M4 has a greater capability to drive current, and therefore it is used as a current sink for drawing a large current (e.g., 10 mA) according to the first current of the first current source 203. The fourth driver 114 and the fourth transistor M4 form a high-speed accurate analog circuit for controlling the voltage at the second node N2 of the LVDS driving circuit 100 according to the data signal DATA.

In an ideal case, if the logic level of the data signal DATA is changed, the voltages at the driving nodes of the drivers 111, 112, 113, and 114 will be changed immediately. As a matter of fact, the transistors M1 to M4 have parasitic capacitances (modeled as virtual capacitors C1 to C4 in the following embodiments) at their control terminals, and the capacitances may result in longer transition delay time and lower operating speed of the LVDS driving circuit 100. In some embodiments, each of the drivers 111, 112, 113, and 114 further includes a fast setting circuit for providing additional driving currents and enhancing the operating speed of the LVDS driving circuit 100. It should be understood that the fast setting circuits are optional elements, and they may be omitted in alternative embodiments.

Figure 3A:
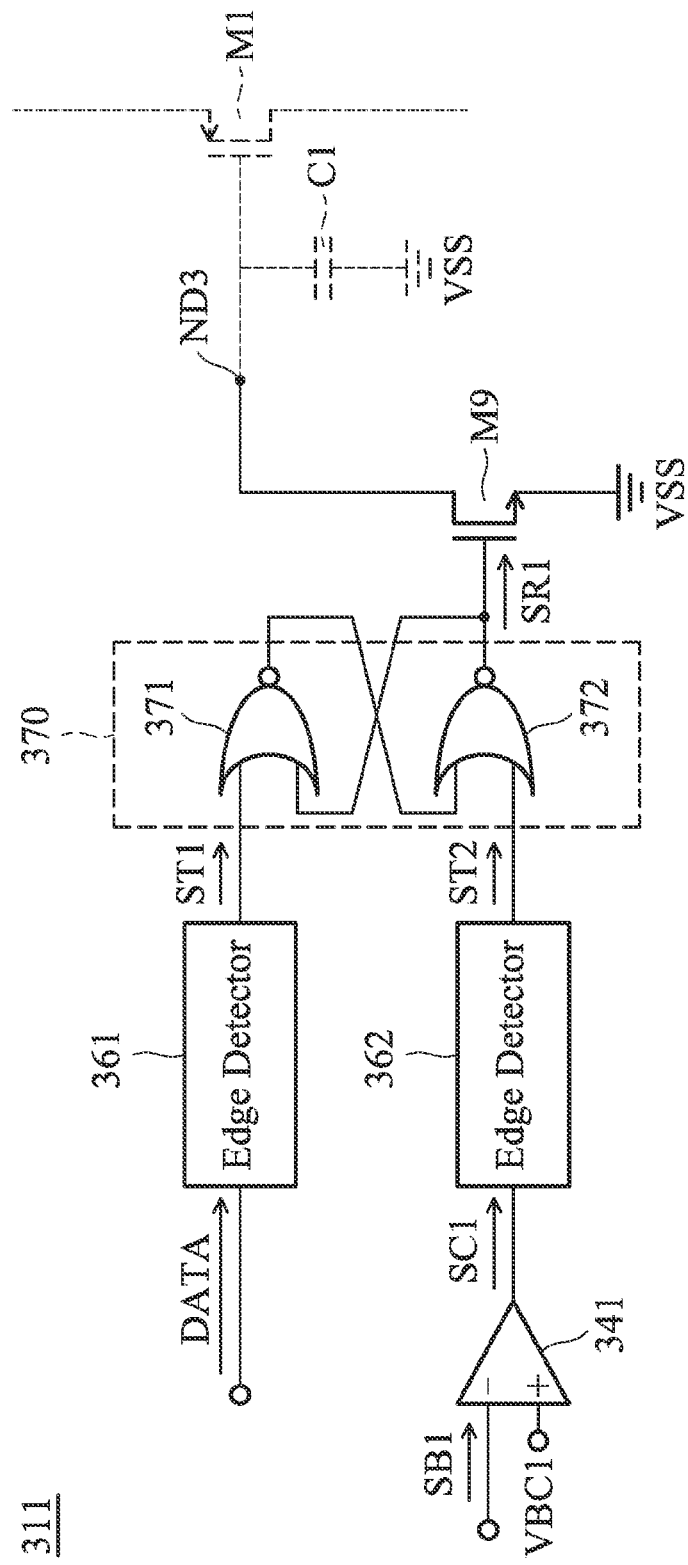
FIG. 3A is a diagram of a fast setting circuit of a first driver according to an embodiment of the invention.
Figure 4:
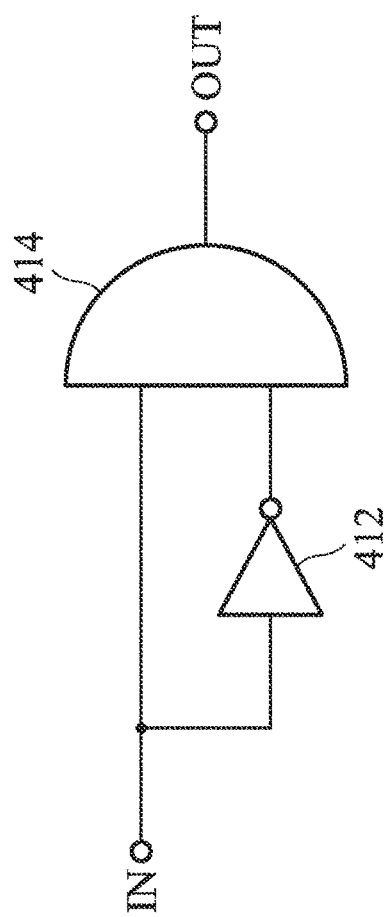
FIG. 4 is a diagram of an edge detector according to an embodiment of the invention.

FIG. 3A is a diagram of the fast setting circuit 311 of the first driver 111 according to an embodiment of the invention. In the embodiment of FIG. 3A, the fast setting circuit 311 of the first driver 111 includes a first comparator 341, a first edge detector 361, a second edge detector 362, a first SR latch 370, and a ninth transistor M9. The first comparator 341 may be implemented with an operational amplifier having no feedback path. The first comparator 341 has a negative input terminal for receiving the first bias signal SB1, a positive input terminal for receiving the first constant bias voltage VBC1, and an output terminal for outputting a first comparison signal SC1 according to a voltage difference between the first constant bias voltage VBC1 and the first bias signal SB1 from the first driving node ND1 of the first driver 111. The first edge detector 361 detects rising edges of the data signal DATA, and generates a first detection signal ST1 accordingly. The second edge detector 362 detects rising edges of the first comparison signal SC1, and generates a second detection signal ST2 accordingly. For example, in the embodiment of FIG. 4, each edge detector with an input terminal IN and an output terminal OUT includes an inverter 412 and an AND gate 414, but the invention is not limited thereto. The inverter 412 has an input terminal coupled to the input terminal IN of the edge detector, and an output terminal. The AND gate 414 has a first input terminal coupled to the input terminal IN of the edge detector, a second input terminal coupled to the output terminal of the inverter 412, and an output terminal used as the output terminal OUT of the edge detector. In one embodiment, the first SR latch 370 includes a first NOR gate 371 and a second NOR gate 372; however, those skilled in the art may implement the SR latch by other configurations such as two cross-coupled NAND gates. The first NOR gate 371 has a first input terminal (acting as the S input of the SR latch) for receiving the first detection signal ST1, a second input terminal, and an output terminal. The second NOR gate 372 has a first input terminal coupled to the output terminal of the first NOR gate 371, a second input terminal (acting as the R input of the SR latch) for receiving the second detection signal ST2, and an output terminal (acting as the Q output of the SR latch) coupled to the second input terminal of the first NOR gate 371. The output terminal of the second NOR gate 372 is further arranged for outputting a first latch signal SR1. The ninth transistor M9 may be an NMOS transistor with a transistor size sufficient to discharge the parasitic capacitances. The ninth transistor M9 has a control terminal for receiving the first latch signal SR1, a first terminal coupled to the ground voltage VSS, and a second terminal coupled to a third driving node ND3. The third driving node ND3 is further coupled to the control terminal of the first transistor M1. With such a design, the ninth transistor M9 of the fast setting circuit 311 provides an additional discharge path for the parasitic capacitor C1 of the first transistor M1, and therefore reduces the transition delay time of the control terminal of the first transistor M1. The reasons will be described in the following embodiments.

Figure 5A:
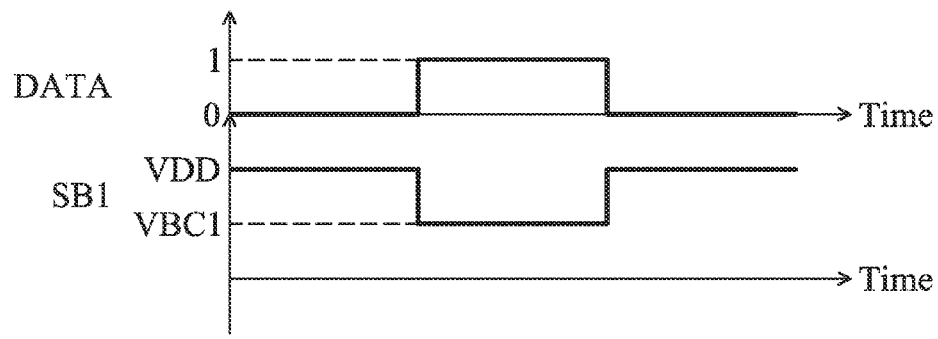
FIG. 5A is a diagram of signal waveforms of a first driver when a first transistor has no parasitic capacitance at its control terminal.
Figure 5B:
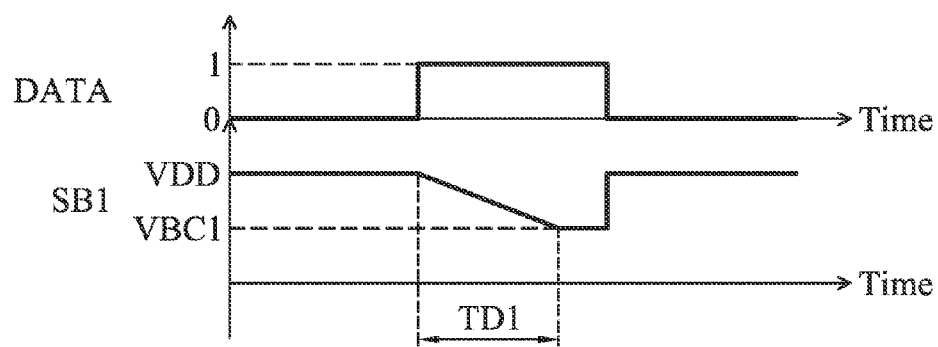
FIG. 5B is a diagram of signal waveforms of a first driver when a first transistor has a large parasitic capacitance at its control terminal.
Figure 5C:
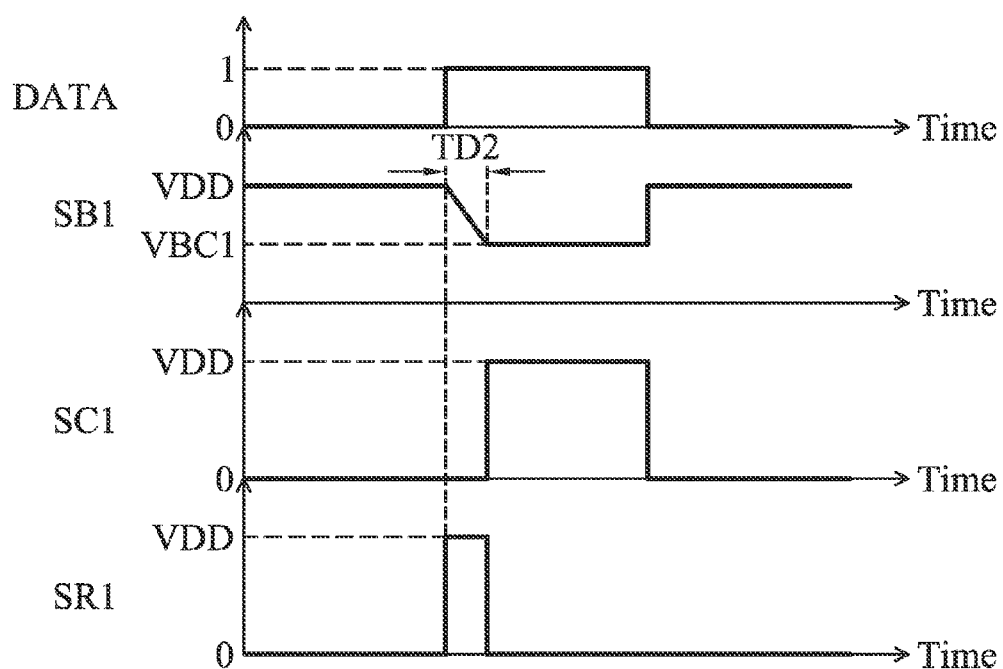
FIG. 5C is a diagram of signal waveforms of a first driver when a first setting circuit is incorporated into a first driver, according to an embodiment of the invention.

FIG. 5A is a diagram of signal waveforms of the first driver 111 when the first transistor M1 has no parasitic capacitance at its control terminal. It is assumed that in an ideal case, the parasitic capacitance of the first transistor M1 is small and negligible. When the data signal DATA input to the first driver 111 shifts from a low logic level (e.g., a logic 0) to a high logic level (e.g., a logic 1), the first bias signal SB1 output from the first driver 111 shifts from a high logic level (e.g., the supply voltage VDD) to a low logic level (e.g., the first constant bias voltage VBC1) immediately. There is no transition delay time in the ideal case of FIG. 5A. FIG. 5B is a diagram of the signal waveforms of the first driver 111 when the first transistor M1 has a large parasitic capacitance at its control terminal. If the parasitic capacitance of the first transistor M1 is considered, the first bias signal SB1 output from the first driver 111 may gradually shift its logic level due to the discharging process of the parasitic capacitor C1, and a transition delay time TD1 may be introduced between the data signal DATA and the first bias signal SB1. FIG. 5C is a diagram of the signal waveforms of the first driver 111 when the first setting circuit 311 is incorporated into the first driver 111, according to an embodiment of the invention. To overcome the slow transition described in FIG. 5B, the first setting circuit 311 may be included in the first driver 111 so as to speed up the discharging process of the parasitic capacitor C1. When the data signal DATA transits from low to high, the first edge detector 361 detects the rising edge of the data signal DATA and outputs the first detection signal ST1 with a high logic level to the S input of the first SR latch 370, and thus the first latch signal SR1 is at a high level. During the above transition of the first bias signal SB1, the first comparison signal SC1 output from the first comparator 341 is still at a low logic level, and therefore the first latch signal SR1 output from the SR latch remains at the high level until the first bias signal SB1 reaches the first constant bias voltage VBC1. After then, the first comparison signal SC1 transits from low to high, the second edge detector 362 detects the rising edge of the first comparison signal SC1 and outputs the second detection signal ST2 with a high logic level to the R input of the first SR latch 370, and thus the first latch signal SR1 is at a low level. The pulse of the first latch signal SR1 temporarily turns on the ninth transistor M9, such that the fast setting circuit 311 provides an additional discharge path for the parasitic capacitor C1 and pulls down the logic level of the first bias signal SB1 within a shorter transition delay time TD2. By using the fast setting circuit 311, the transition delay time of the first driver 111 can be significantly reduced, and the operating speed of the first driver 111 and the first transistor M1 can be identical to that of the ideal case of FIG. 5A.

Figure 3B:
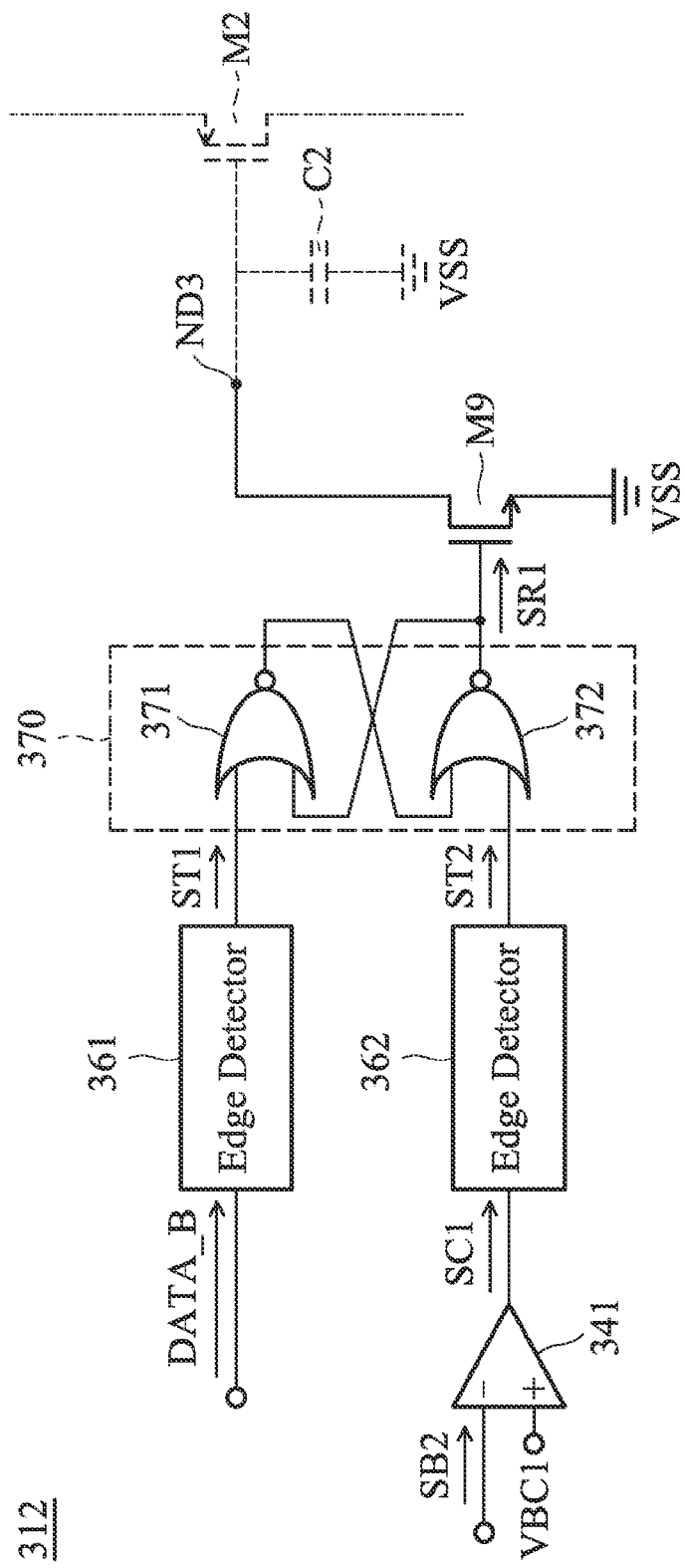
FIG. 3B is a diagram of a fast setting circuit of a second driver according to an embodiment of the invention.

FIG. 3B is a diagram of the fast setting circuit 312 of the second driver 112 according to an embodiment of the invention. The fast setting circuit 312 of the second driver 112 of FIG. 3B is similar to the fast setting circuit 311 of the first driver 111 of FIG. 3A. The difference between them is that in the fast setting circuit 312 of the second driver 112, the negative input terminal of the first comparator 341 is arranged for receiving the second bias signal SB2, the first edge detector 361 detects rising edge of the inverted data signal DATA_B and generates the first detection signal ST1, and the third driving node ND3 is coupled to the control terminal of the second transistor M2. It should be understood that the fast setting circuit 312 of the second driver 112 does not share any elements (e.g., the first comparator 341, the ninth transistor M9, etc., which appear in both FIG. 3A and FIG. 3B) with the fast setting circuit 311 of the first driver 111. The same reference numerals of elements are used for readers to understand that the two circuits have similar structures and partially-identical elements. As a matter of fact, every element of FIG. 3B is independent of that of FIG. 3A. The ninth transistor M9 of the fast setting circuit 312 provides an additional discharge path for the parasitic capacitor C2 of the second transistor M2, and therefore reduces the transition delay time of the control terminal of the second transistor M2.

Figure 3C:
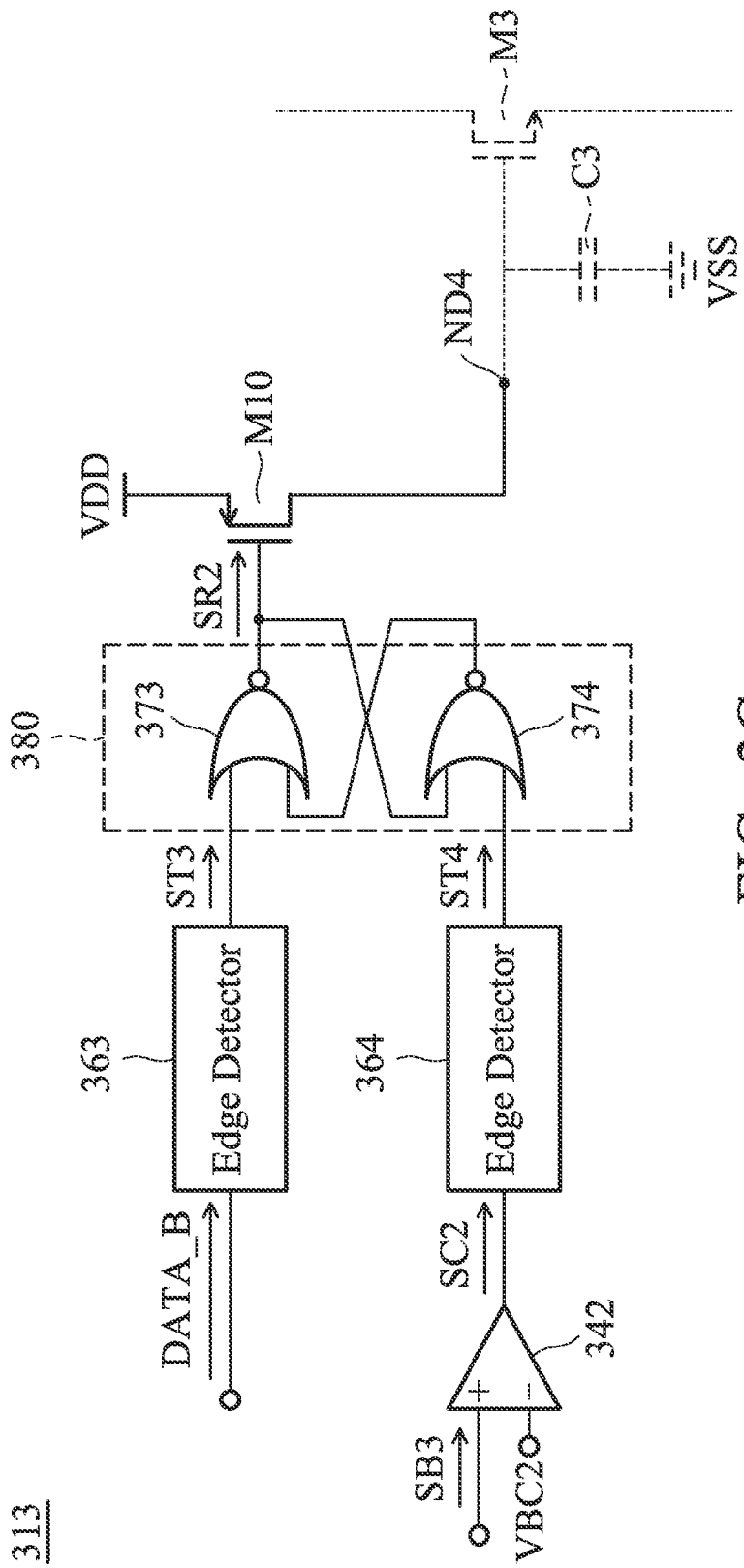
FIG. 3C is a diagram of a fast setting circuit of a third driver according to an embodiment of the invention.

FIG. 3C is a diagram of the fast setting circuit 313 of the third driver 113 according to an embodiment of the invention. In the embodiment of FIG. 3C, the fast setting circuit 313 of the third driver 113 includes a second comparator 342, a third edge detector 363, a fourth edge detector 364, a second SR latch 380, and a tenth transistor M10. The second comparator 342 may be implemented with an operational amplifier having no feedback path. The second comparator 342 has a negative input terminal for receiving the second constant bias voltage VBC2, a positive input terminal for receiving the third bias signal SB3, and an output terminal for outputting a second comparison signal SC2 according to a voltage difference between the second constant bias voltage VBC2 and the third bias signal SB3 from the second driving node ND2 of the third driver 113. The third edge detector 363 detects rising edges of the inverted data signal DATA_B, and generates a third detection signal ST3 accordingly. The fourth edge detector 364 detects rising edges of the second comparison signal SC2, and generates a fourth detection signal ST4 accordingly. The detailed circuit of each edge detector has been described in the embodiment of FIG. 4. In one embodiment, the second SR latch 380 includes a third NOR gate 373 and a fourth NOR gate 374; however, those skilled in the art may implement the SR latch by other configurations such as two cross-coupled NAND gates. The third NOR gate 373 has a first input terminal (acting as the R input of the SR latch) for receiving the third detection signal ST3, a second input terminal, and an output terminal (acting as the Q output of the SR latch). The fourth NOR gate 374 has a first input terminal coupled to the output terminal of the third NOR gate 373, a second input terminal (acting as the S input of the SR latch) for receiving the fourth detection signal ST4, and an output terminal coupled to the second input terminal of the third NOR gate 373. The output terminal of the third NOR gate 373 is further arranged for outputting a second latch signal SR2. The tenth transistor M10 may be a PMOS transistor with a transistor size sufficient to discharge the parasitic capacitances. The tenth transistor M10 has a control terminal for receiving the second latch signal SR2, a first terminal coupled to the supply voltage VDD, and a second terminal coupled to a fourth driving node ND4. The fourth driving node ND4 is further coupled to the control terminal of the third transistor M3. The operating principles of the fast setting circuit 313 are similar to those of the first setting circuit 311 described in above, and the logic level of the third bias signal SB3 may be pulled up from a low logic level (e.g., the ground voltage VSS) to a high logic level (e.g., the second constant bias voltage VBC2) within a shorter transition delay time. With such a design, the tenth transistor M10 of the fast setting circuit 314 provides an additional charge path for the parasitic capacitor C3 of the third transistor M3, and therefore reduces the transition delay time of the control terminal of the third transistor M3.

Figure 3D:
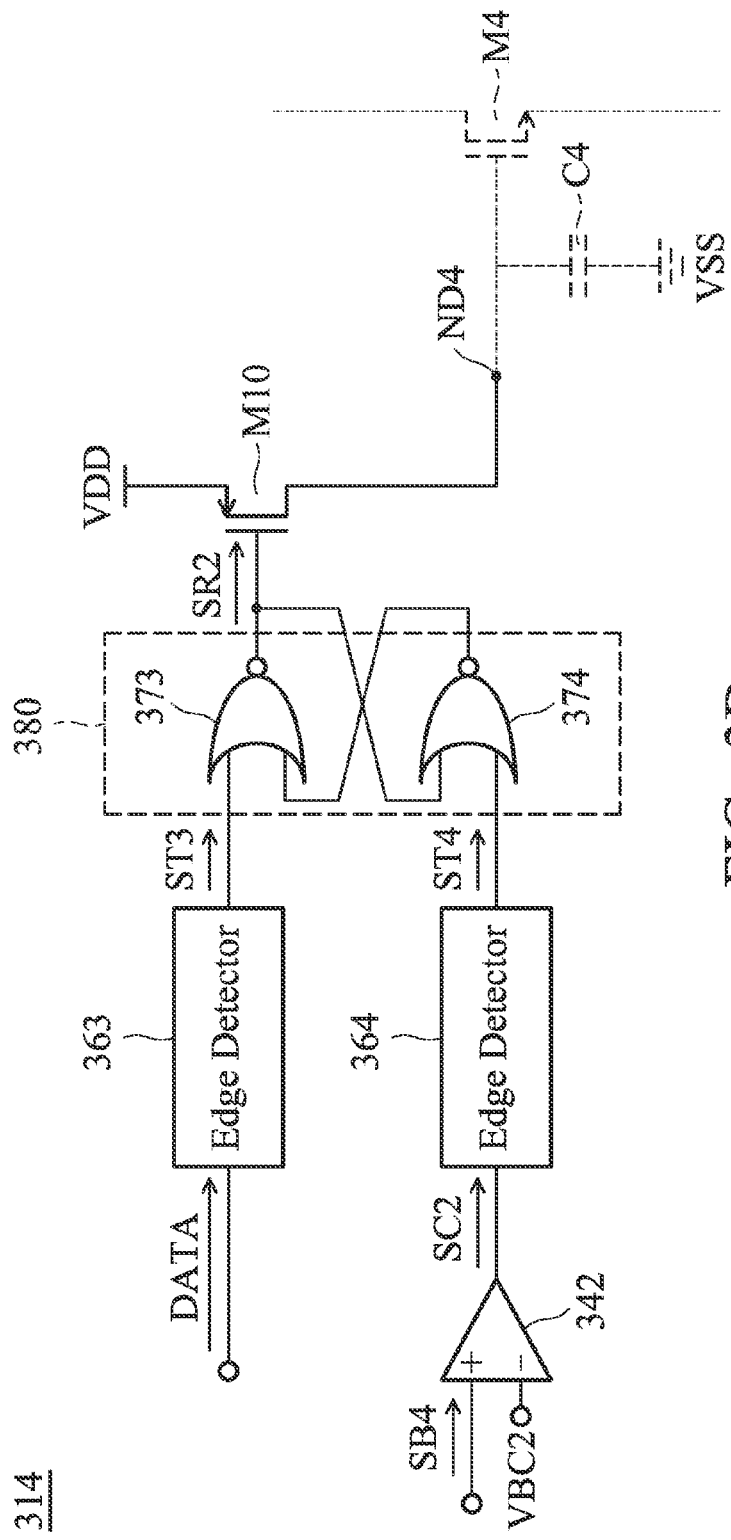
FIG. 3D is a diagram of a fast setting circuit of a fourth driver according to an embodiment of the invention.

FIG. 3D is a diagram of the fast setting circuit 314 of the fourth driver 114 according to an embodiment of the invention. The fast setting circuit 314 of the fourth driver 114 of FIG. 3D is similar to the fast setting circuit 313 of the third driver 113 of FIG. 3C. The difference between them is that in the fast setting circuit 314 of the fourth driver 114, the positive input terminal of the second comparator 342 is arranged for receiving the fourth bias signal SB4, the third edge detector 363 detects rising edge of the data signal DATA and generates the third detection signal ST3, and the fourth driving node ND4 is coupled to the control terminal of the fourth transistor M4. It should be understood that the fast setting circuit 314 of the fourth driver 114 does not share any elements with the fast setting circuit 313 of the third driver 113. Every element of FIG. 3D is independent of that of FIG. 3C. The tenth transistor M10 of the fast setting circuit 314 provides an additional charge path for the parasitic capacitor C4 of the fourth transistor M4, and therefore reduces the transition delay time of the control terminal of the fourth transistor M4.

As the data transmission rates in differential signaling circuits become higher, the high-frequency loss on the transmission line increases. Since transition edges (rising edges and falling edges) of the differential signal output by the LVDS driving circuit are composed of high-frequency components, such transition edges are easily attenuated, and thus ISI (intersymbol interference) may reduce the signal quality and the eye diagram opening may be narrowed. To prevent the situation described above from occurring, another embodiment of the present invention has been proposed, in which the amplitude of the differential signal output by the LVDS driving circuit is increased, during the state transitions, to emphasize the transition edges and avoid attenuation.

Diagrams of a first driver 611, a second driver 612, a third driver 613, and a fourth driver 614 of the bias driver 110 are shown in FIG. 6A to 6D, respectively, according to another embodiment of the invention. The first driver 611, the second driver 612, the third driver 613, and the fourth driver 614 in FIG. 6A to 6D are similar to the first driver 111, the second driver 112, the third driver 113, and the fourth driver 114 in FIG. 2A to 2D, respectively, while the difference between them is that each of the first driver 611, the second driver 612, the third driver 613, and the fourth driver 614 further includes an additional current sink 601 (or current source 603) and an additional switch 651 (or 653). The same reference numerals of elements are used for readers to understand that the corresponding circuits have similar structures and partially-identical elements.

Figure 6A:
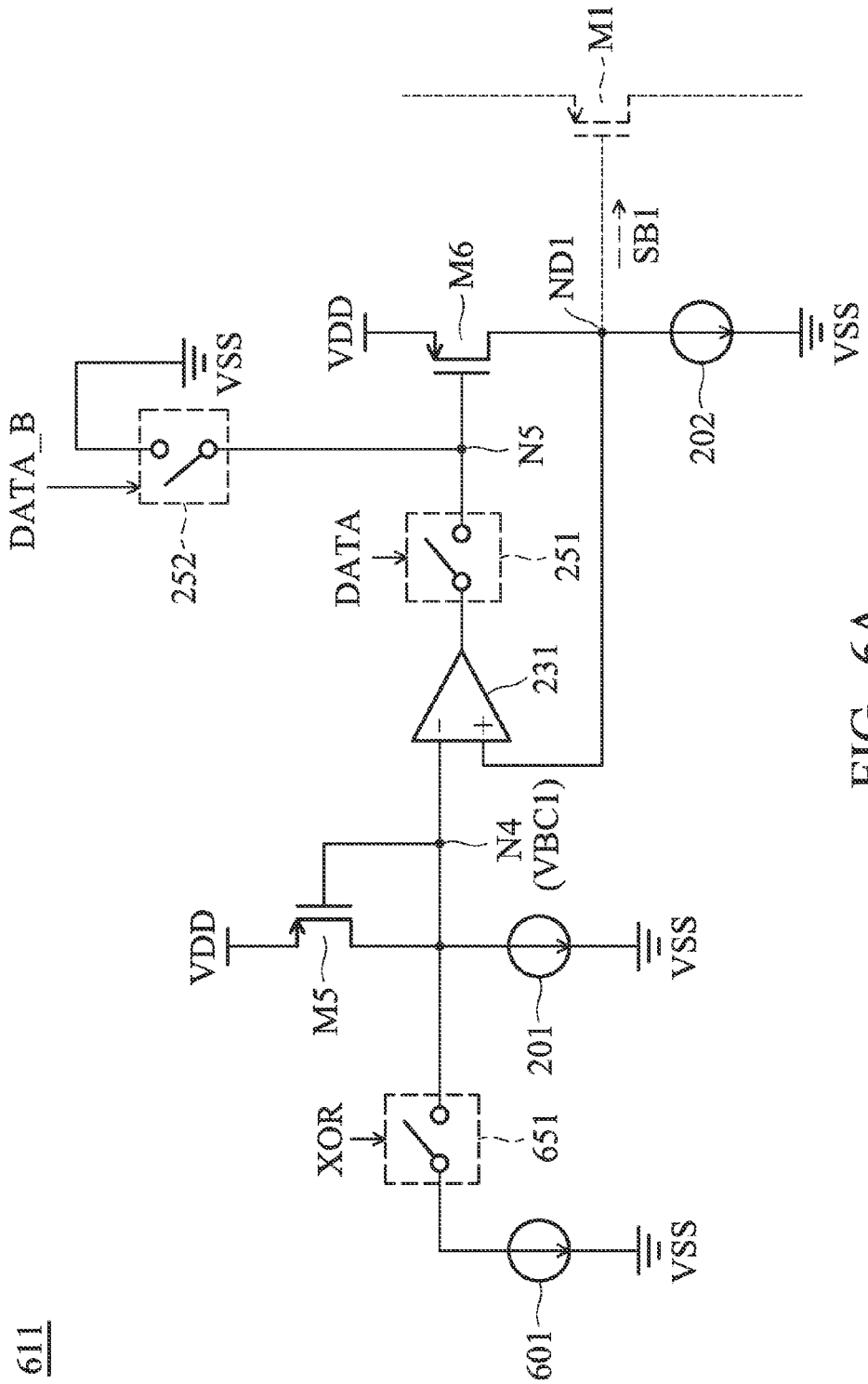
FIG. 6A is a diagram of a first driver according to another embodiment of the invention.
Figure 7A:
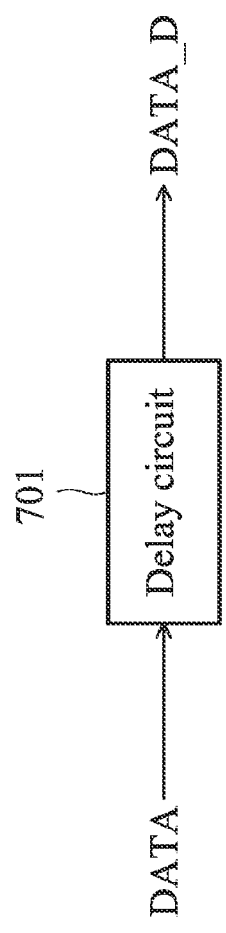
FIG. 7A is a diagram of a delay circuit according to an embodiment of the invention.
Figure 7B:
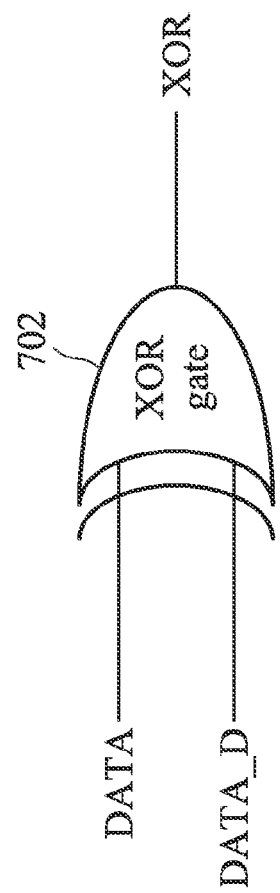
FIG. 7B is a diagram of a XOR gate according to an embodiment of the invention.
Figure 7C:
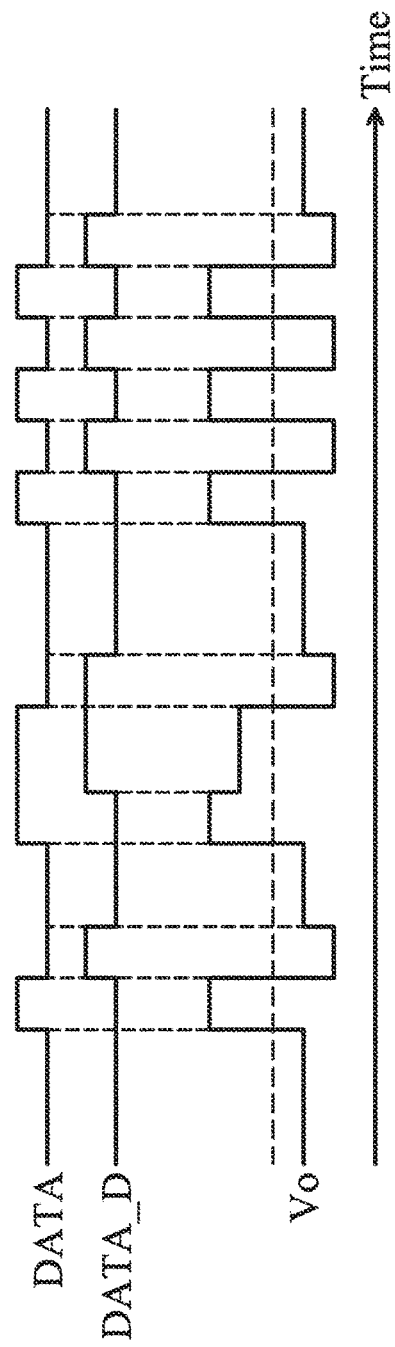
FIG. 7C is a diagram of signal waveforms when the output voltage of the LVDS driving circuit is increased at times of state transitions, according to an embodiment of the invention.

FIG. 6A is the diagram of the first driver 611 according to an embodiment of the invention. The operating principles of the elements of the first driver 611 that are the same as in the first driver 111 of FIG. 2A have been described in above and are not repeated here. The first driver 611 further includes a fifth switch 651 and a third current sink 601; the fifth switch 651 has a first terminal coupled to the fourth node N4 and a second terminal coupled to the third current sink 601, and the third current sink 601 draws a second current from the fourth node N4 when the third current sink 601 is coupled to the fourth node N4 via the fifth switch 651. The fifth switch 651 is controlled by an exclusive OR (XOR) signal XOR, which shall be described referring to FIG. 7A to 7C. A delay circuit 701 of FIG. 7A generates a delayed data signal DATA_D by delaying the data signal DATA with a time delay. In one embodiment, the delay circuit 701 may include one or multiple serially connected inverters to generate the time delay, but the invention is not limited thereto. In one embodiment, the time delay may be the bit time of the data signal DATA, but the invention is not limited thereto. The XOR signal XOR is generated by a XOR gate 702 of FIG. 7B, which has a first input terminal for receiving the data signal DATA, a second input terminal for receiving the delayed data signal DATA_D, and an output terminal for outputting the XOR signal XOR. Therefore, when the first current mirror is formed between the first transistor M1 and the fifth transistor M5 as described previously, the third current sink 601 is coupled to the fourth node N4 via the fifth switch 651 (and thus draws the second current from the fourth node N4) when the XOR result of the data signal DATA and the delayed data signal DATA_D is logical high, i.e., when the data signal DATA is at a high logic level and the delayed data signal DATA_D is at a low logic level, or vice versa (that is to say, when there is a state transition in the data signal DATA); on the contrary, the third current sink 601 is not coupled to the fourth node N4 via the fifth switch 651 (and thus does not draw the second current from the fourth node N4) when the XOR result of the data signal DATA and the delayed data signal DATA_D is logical low (that is to say, when there is no state transition in the data signal DATA). Since the current passing through the first transistor M1 is mirrored from the current passing through the fifth transistor M5 (which is the current drawn from the fourth node N4), the current passing through the first transistor M1 when there is a state transition is higher than when there is no state transition. FIG. 7C shows time diagrams of the data signal DATA, the delayed data signal DATA_D, and an output voltage Vo which is the voltage difference between a voltage at the first node N1 and a voltage at the second node N2 and is determined by the current passing through the first transistor M1 and the fourth transistor M4 (or the second transistor M2 and the third transistor M3) and the resistances of the first resistor R1 and the second resistor R2. It may be seen that the amplitude of the output voltage Vo of the LVDS driving circuit 100 is increased at the times of state transitions of the data signal DATA (compared with times without state transitions), and thus the transition edges are emphasized and attenuation is avoided.

Figure 6B:
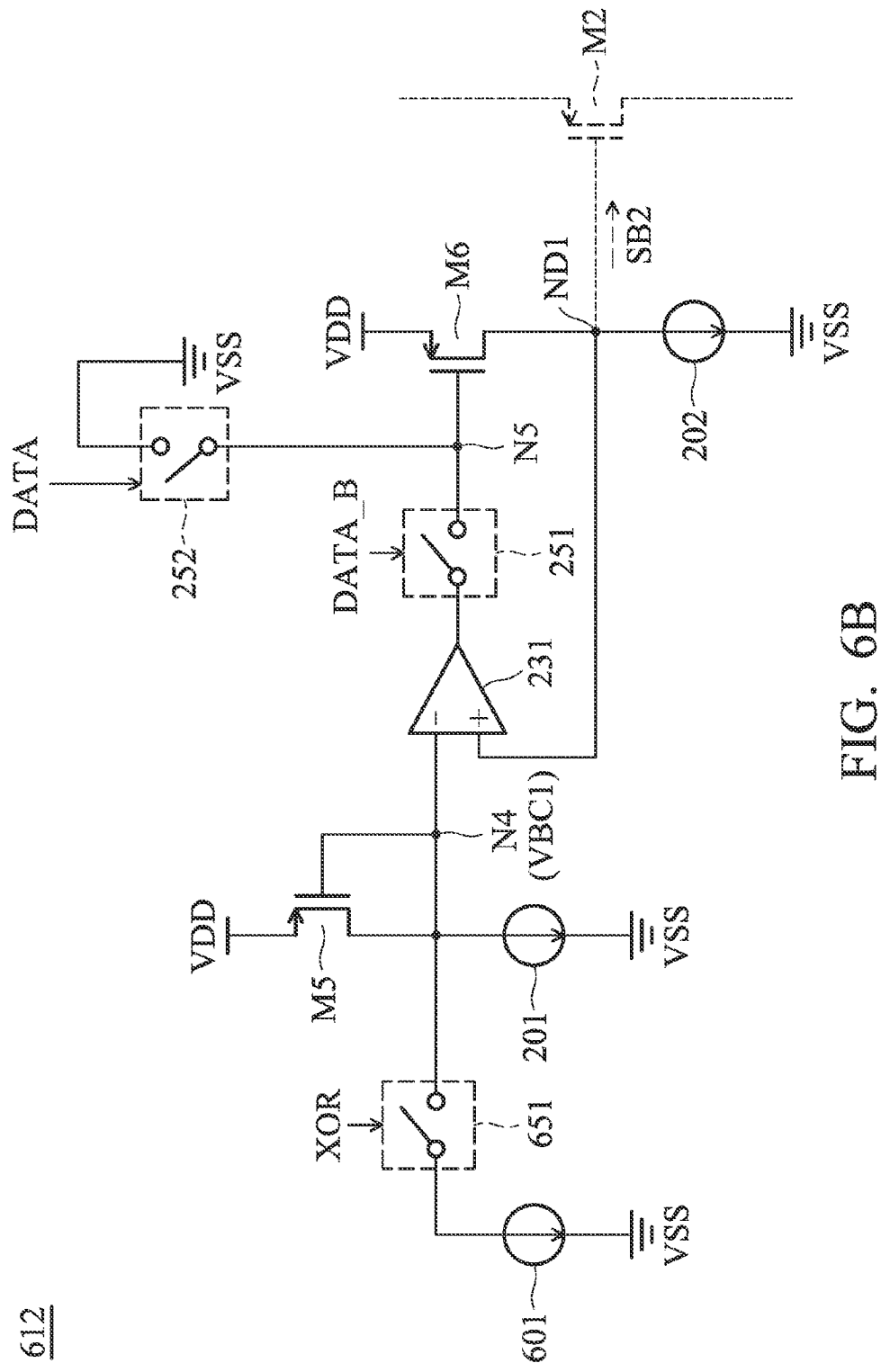
FIG. 6B is a diagram of a second driver according to another embodiment of the invention.

FIG. 6B is the diagram of the second driver 612 according to an embodiment of the invention. The operating principles of the elements of the second driver 612 that are the same as in the second driver 112 of FIG. 2B have been described in above and are not repeated here. The second driver 612 further includes a fifth switch 651 and a third current sink 601, which are also similar to those of the first driver 611 of FIG. 6A. Therefore, when the second current mirror is formed between the second transistor M2 and the fifth transistor M5 as described previously, the third current sink 601 is coupled to the fourth node N4 via the fifth switch 651 (and thus draws the second current from the fourth node N4) when the XOR result of the data signal DATA and the delayed data signal DATA_D is logical high, i.e., when the data signal DATA is at a high logic level and the delayed data signal DATA_D is at a low logic level, or vice versa (that is to say, when there is a state transition in the data signal DATA); on the contrary, the third current sink 601 is not coupled to the fourth node N4 via the fifth switch 651 (and thus does not draw the second current from the fourth node N4) when the XOR result of the data signal DATA and the delayed data signal DATA_D is logical low (that is to say, when there is no state transition in the data signal DATA). Since the current passing through the second transistor M2 is mirrored from the current passing through the fifth transistor M5 (which is the current drawn from the fourth node N4), the current passing through the second transistor M2 when there is a state transition is higher than when there is no state transition.

Figure 6C:
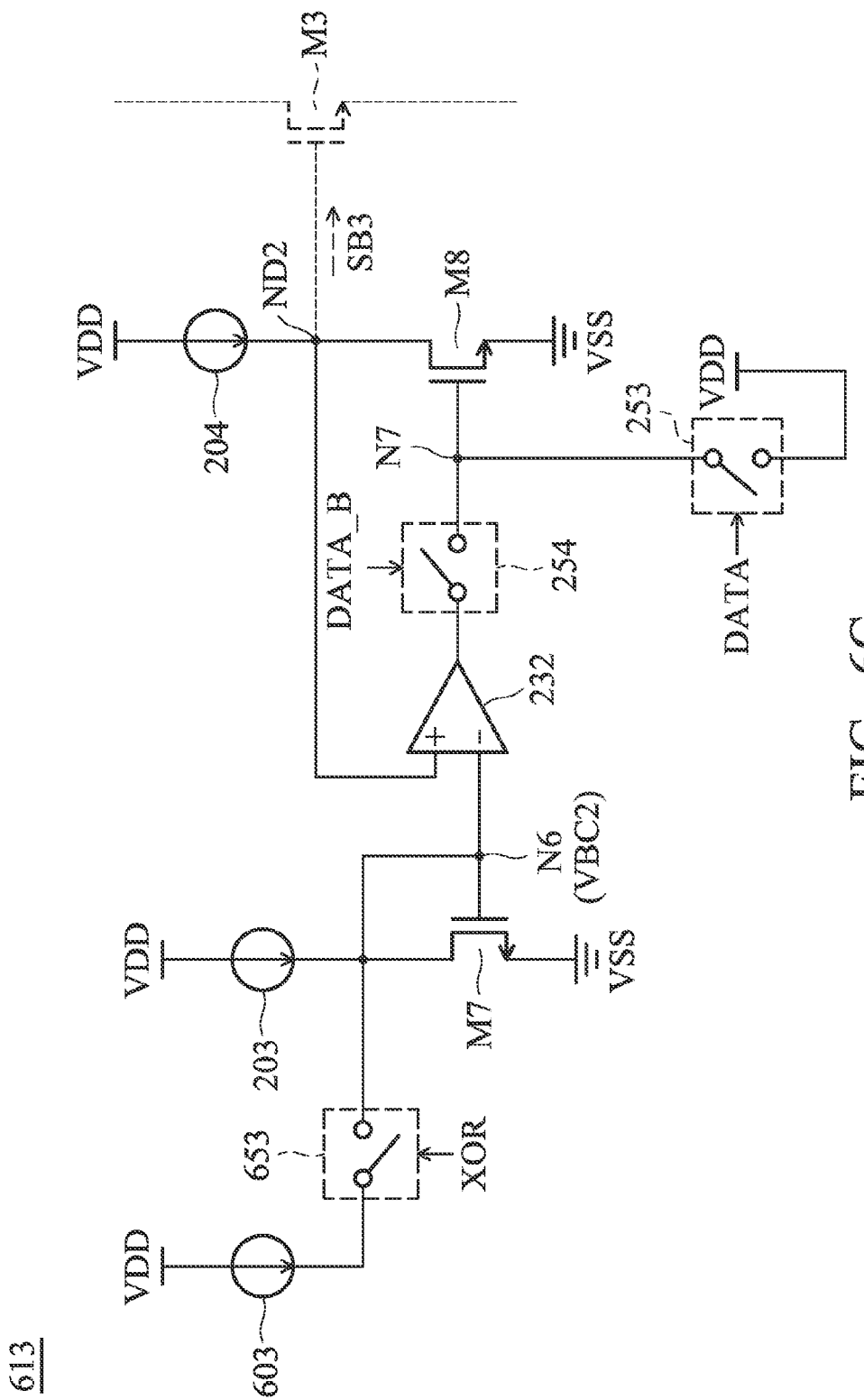
FIG. 6C is a diagram of a third driver according to another embodiment of the invention.

FIG. 6C is the diagram of the third driver 613 according to an embodiment of the invention. The operating principles of the elements of the third driver 613 that are the same as in the third driver 113 of FIG. 2C have been described in above and are not repeated here. The third driver 613 further includes a sixth switch 653 and a third current source 603; the sixth switch 653 has a first terminal coupled to the sixth node N6 and a second terminal coupled to the third current source 603, and the third current source 603 supplies a second current to the sixth node N6 when third current source 603 is coupled to the sixth node N6 via the sixth switch 653. The sixth switch 653 is also controlled by the XOR signal XOR, and thus the operating principles of the sixth switch 653 and the third current source 603 are analogous to those of the fifth switch 651 and the third current sink 601 in above. Therefore, when the third current mirror is formed between the third transistor M3 and the seventh transistor M7 as described previously, the third current source 603 is coupled to the sixth node N6 via the sixth switch 653 (and thus supplies the second current to the sixth node N6) when the XOR result of the data signal DATA and the delayed data signal DATA_D is logical high, i.e., when the data signal DATA is at a high logic level and the delayed data signal DATA_D is at a low logic level, or vice versa (that is to say, when there is a state transition in the data signal DATA); on the contrary, the third current source 603 is not coupled to the sixth node N6 via the sixth switch 653 (and thus does not supply the second current to the sixth node N6) when the XOR result of the data signal DATA and the delayed data signal DATA_D is logical low (that is to say, when there is no state transition in the data signal DATA). Since the current passing through the third transistor M3 is mirrored from the current passing through the seventh transistor M7 (which is the current supplied to the sixth node N6), the current passing through the third transistor M3 when there is a state transition is higher than when there is no state transition.

Figure 6D:
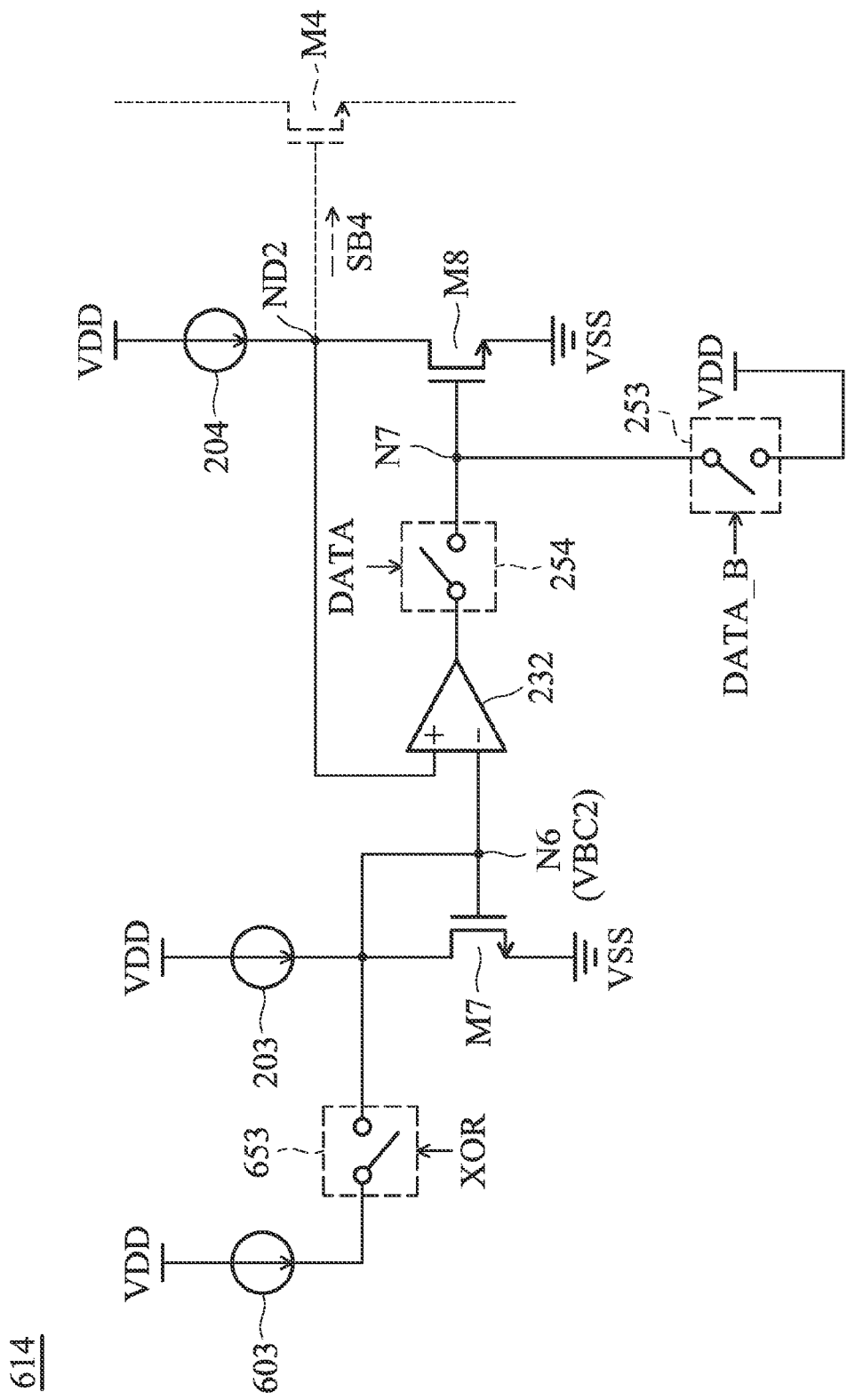
FIG. 6D is a diagram of a fourth driver according to another embodiment of the invention.

FIG. 6D is the diagram of the fourth driver 614 according to an embodiment of the invention. The operating principles of the elements of the fourth driver 614 that are the same as in the fourth driver 114 of FIG. 2D have been described in above and are not repeated here. The s fourth driver 614 further includes a sixth switch 653 and a third current source 603, which are also similar to those of the third driver 613 of FIG. 6C. Therefore, when the fourth current mirror is formed between the fourth transistor M4 and the seventh transistor M7 as described previously, the third current source 603 is coupled to the sixth node N6 via the sixth switch 653 (and thus supplies the second current to the sixth node N6) when the XOR result of the data signal DATA and the delayed data signal DATA_D is logical high, i.e., when the data signal DATA is at a high logic level and the delayed data signal DATA_D is at a low logic level, or vice versa (that is to say, when there is a state transition in the data signal DATA); on the contrary, the third current source 603 is not coupled to the sixth node N6 via the sixth switch 653 (and thus does not supply the second current to the sixth node N6) when the XOR result of the data signal DATA and the delayed data signal DATA_D is logical low (that is to say, when there is no state transition in the data signal DATA). Since the current passing through the fourth transistor M4 is mirrored from the current passing through the seventh transistor M7 (which is the current supplied to the sixth node N6), the current passing through the fourth transistor M4 when there is a state transition is higher than when there is no state transition.

Figure 8:
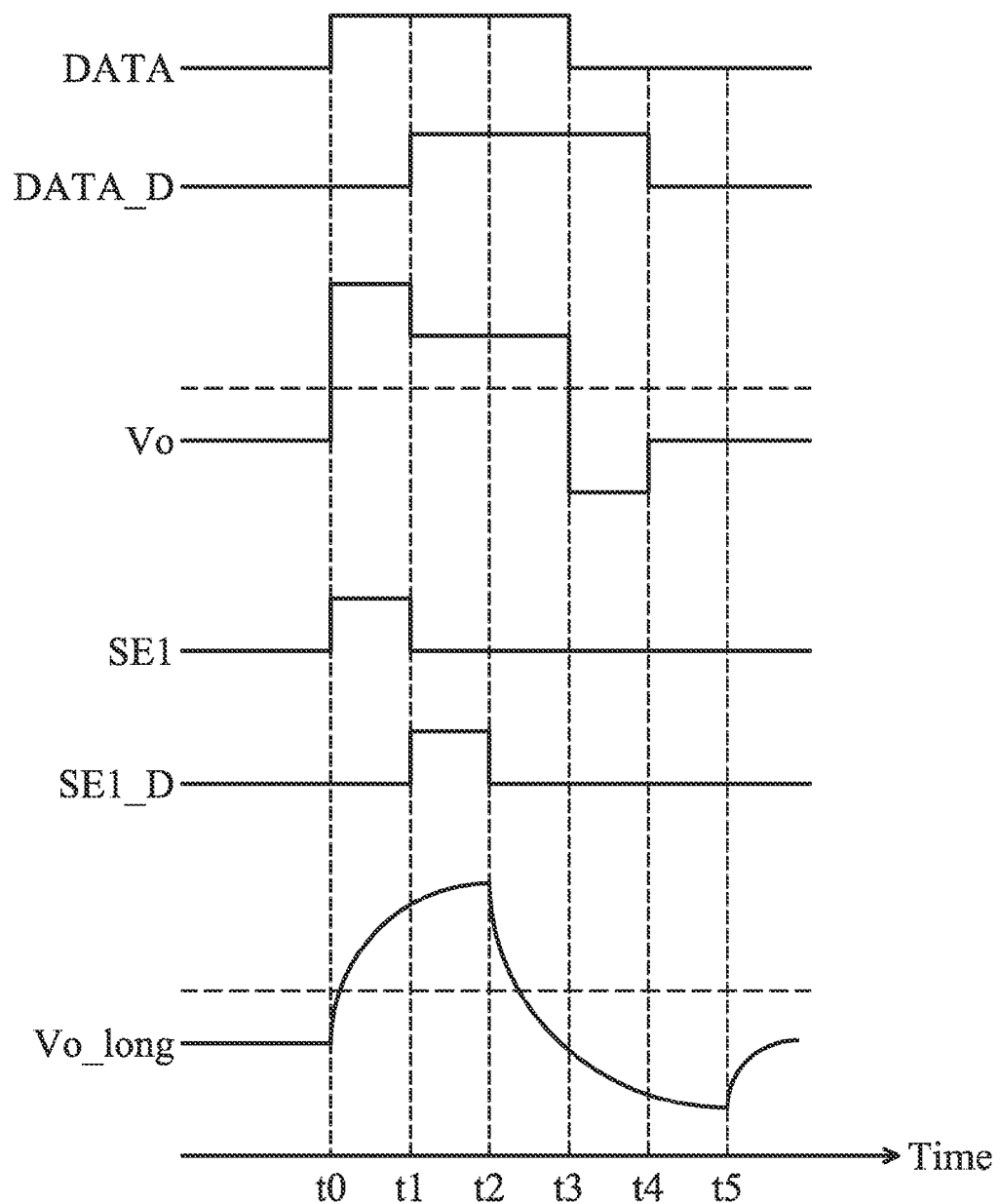
FIG. 8 is a diagram of signal waveforms when the LVDS driving circuit has a long transmission line, according to an embodiment of the invention.

The waveform of the output voltage Vo in FIG. 7C represents an ideal situation; in reality, if the transmission lines coupled to the first node N1 and the second node N2 of the LVDS driving circuit 100 are long, the resistance and capacitance of the transmission lines may distort the waveform of the output voltage Vo due to significant RC delay effects. FIG. 8 shows the waveform of the output voltage Vo in an ideal situation and the waveform of the output voltage Vo_long of the LVDS driving circuit 100 with a long transmission line. It may be seen that the amplitudes of the output voltage Vo at the times of state transitions (such as at times t0 and t3) of the data signal DATA should ideally be increased, when comparing them with times without state transitions (such as at times t2 and t5); however, in the waveform of the output voltage Vo_long, the amplitudes of the output voltage Vo_long at the times t0 and t3 are lower than those at the times t2 and t5 instead due to significant RC delay. To prevent the situation described above from occurring, another embodiment of the present invention has been proposed, in which the third current sink 601/third current source 603 is a variable current sink/source, and the second current is adjusted to thereby overcome the RC delay and emphasize the transition edges. In one embodiment, the variable current sink/source may be implemented with a current-output digital-to-analog converter (IDAC) coupled to a counter, wherein the counter outputs control bits to the IDAC so as to adjust the second current drawn/supplied, but the invention is not limited thereto. In one embodiment, the variable current sink/source may be manually adjusted, such as by manually controlling the counter via a user interface to increase or decrease the control bits output to the IDAC. In another embodiment, the variable current sink/source may be automatically adjusted according to the output voltage Vo, wherein the output voltage Vo may be obtained by calculating the voltage difference between the voltage at the first node N1 and the voltage at the second node N2 using, for example, a voltage subtractor circuit well known to those skilled in the related art. In one embodiment, the adjustment of the variable current sink/source may be carried out during a handshaking period before beginning to transmit the actual data signal, in which a handshaking data pattern is used as the data signal to generate the output voltage Vo; during the handshaking period, the variable current sink/source is adjusted to draw/supply a suitable second current, and the second current remains constant after the handshaking period (i.e., remains constant during the transmission of the actual data signal), but the invention is not limited thereto.

Figure 9:
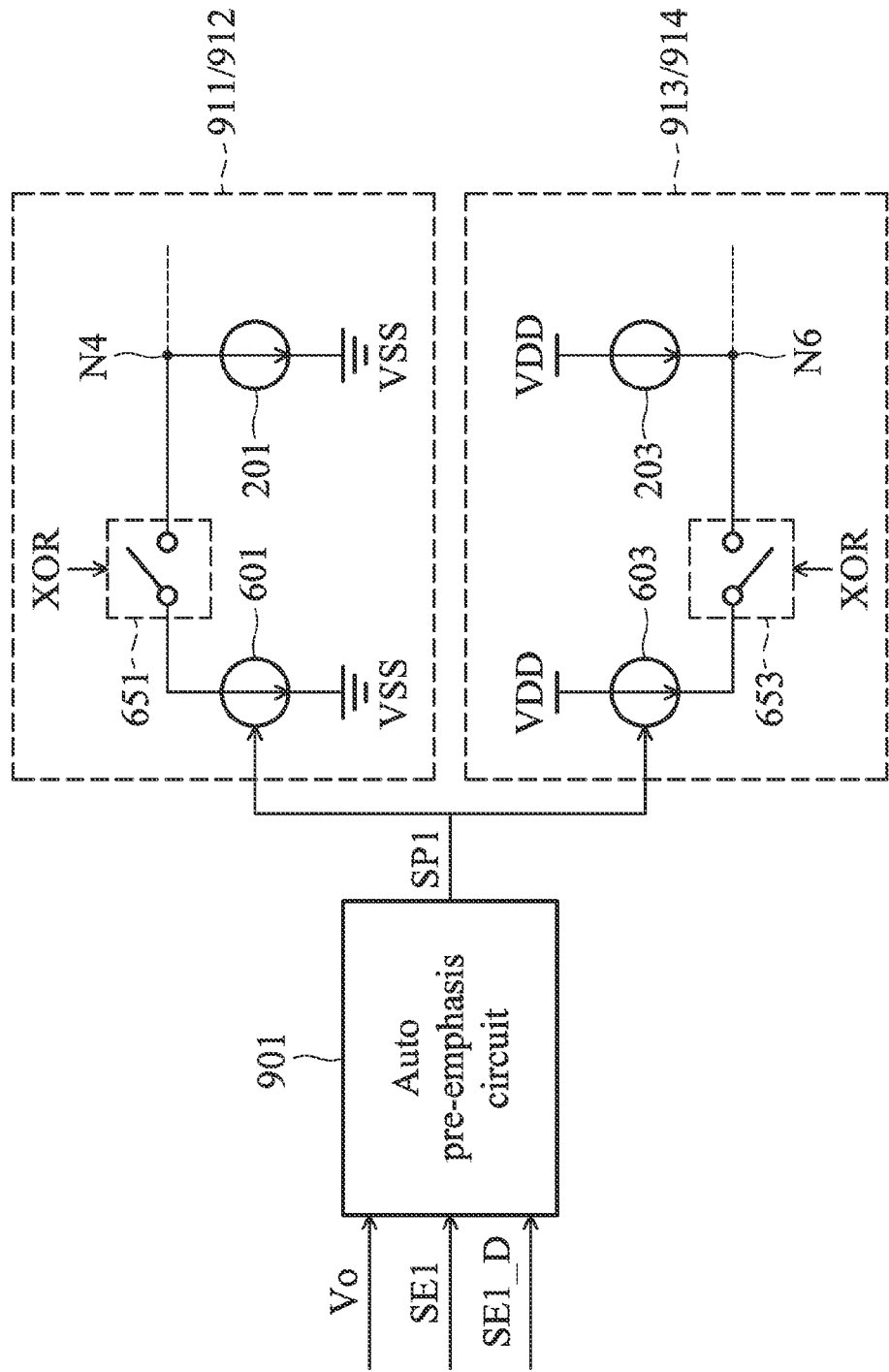
FIG. 9 is a diagram of the LVDS driving circuit according to another embodiment of the invention.

FIG. 9 is the diagram of the LVDS driving circuit 100 with a first driver 911, a second driver 912, a third driver 913, and a fourth driver 914 according to an embodiment of the invention. Compared with the embodiments in FIG. 6A to 6D, the LVDS driving circuit 100 further includes an auto pre-emphasis circuit 901 coupled to the third current sinks 601 (which are variable current sinks) of the first driver 911/second driver 912 and the third current sources 603 (which are variable current sources) of the third driver 913/fourth driver 914, while the other elements in the first driver 911, the second driver 912, the third driver 913, and the fourth driver 914 are the same as in the first driver 611, the second driver 612, the third driver 613, and the fourth driver 614, respectively. Elements other than the first current sink 201, the fifth switch 651, and the third current sink 601 in the first driver 911/second driver 912 are not illustrated in FIG. 9 for simplicity, and elements other than the first current source 203, the sixth switch 653, and the third current source 603 in the third driver 913/fourth driver 914 are not illustrated in FIG. 9 for simplicity. The operating principles of the elements of the first driver 911/second driver 912/third driver 913/fourth driver 914 that are the same as in the first driver 611/second driver 612/third driver 613/fourth driver 614 in FIG. 6A to 6D have been described in above and are not repeated here. In one embodiment, the auto pre-emphasis circuit 901 receives the output voltage Vo, a transition edge signal SE1, and a delayed transition edge signal SE1_D to generate a pre-emphasis signal SP1 to control the third current sinks 601 of the first driver 911/second driver 912 and the third current sources 603 of the third driver 913/fourth driver 914, so as to adjust the second currents drawn/supplied. In another embodiment, the auto pre-emphasis circuit 901 may receive the voltage at the first node N1 and the voltage at the second node N2 instead of the output voltage Vo, and the auto pre-emphasis circuit 901 may obtain the output voltage Vo by calculating the voltage difference between the voltage at the first node N1 and the voltage at the second node N2 using, for example, a voltage subtractor circuit well known to those skilled in the related art. In one embodiment, the auto pre-emphasis circuit 901 may adjust the third current sinks 601 and the third current sources 603 during a rising edge, and the transition edge signal SE1 may be generated according to an AND result of the data signal DATA and an inverse of the delayed data signal DATA_D (as shown in FIG. 8), so that the transition edge signal SE1 is logical high when there is a rising edge in the data signal DATA. In another embodiment, the auto pre-emphasis circuit 901 may adjust the third current sinks 601 and the third current sources 603 during a falling edge, and the transition edge signal SE1 may be generated according to an AND result of the delayed data signal DATA_D and an inverse of the data signal DATA (not shown), so that the transition edge signal SE1 is logical high when there is a falling edge in the data signal DATA. A delay circuit similar to the delay circuit 701 of FIG. 7A may be used to generate the delayed transition edge signal SE1_D by delaying the transition edge signal SE1 with a time delay; in one embodiment, the time delay between the delayed transition edge signal SE1_D and the transition edge signal SE1 may be the same as the time delay between the delayed data signal DATA_D and the data signal DATA. In one embodiment, the LVDS driving circuit 100 may further include a starting switch (not shown) coupled between the auto pre-emphasis circuit 901 and the third current sinks 601/third current sources 603, wherein the starting switch is on during the handshaking period to adjust the third current sinks 601/third current sources 603, and off after the handshaking period so that the second current remains constant during the transmission of the actual data signal.

Figure 10:
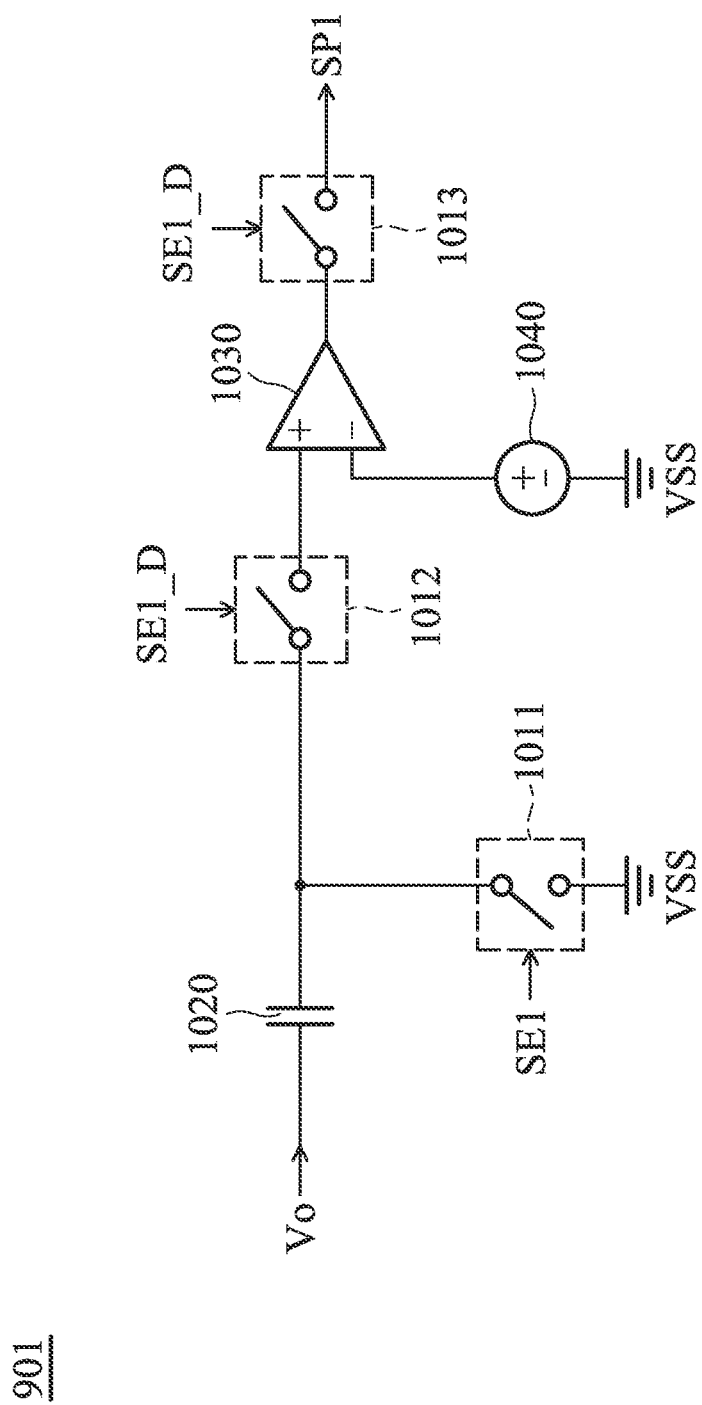
FIG. 10 is a diagram of an auto pre-emphasis circuit according to an embodiment of the invention.

FIG. 10 is a diagram of the auto pre-emphasis circuit 901 according to an embodiment of the invention. The auto pre-emphasis circuit 901 includes a capacitor 1020, a seventh switch 1011, an eighth switch 1012, and a third operational amplifier 1030. The capacitor 1020 has a first terminal receiving the output voltage Vo, and a second terminal. The seventh switch 1011 has a first terminal coupled to the second terminal of the capacitor 1020, and a second terminal coupled to the ground voltage VSS, wherein the seventh switch 1011 is on when the transition edge signal SE1 is logical high and off when the transition edge signal SE1 is logical low. The eighth switch 1012 has a first terminal coupled to the second terminal of the capacitor 1020, and a second terminal, wherein the eighth switch 1012 is on when the delayed transition edge signal SE1_D is logical high and off when the delayed transition edge signal SE1_D is logical low. The third operational amplifier 1030 has a positive input terminal coupled to the second terminal of the eighth switch 1012, a negative input terminal coupled to the ground voltage VSS, and an output terminal outputting the pre-emphasis signal SP1. In one embodiment, the negative input terminal of the third operational amplifier 1030 is coupled to the ground voltage VSS via a reference voltage source 1040, which may have a negative reference voltage Vref (e.g., −0.5V). In one embodiment, the auto pre-emphasis circuit 901 further includes a ninth switch 1013 having a first terminal coupled to the output terminal of the third operational amplifier 1030, and a second terminal coupled to the third current sinks 601 of the first driver 911/second driver 912 and the third current sources 603 of the third driver 913/fourth driver 914, wherein the ninth switch 1013 is on when the delayed transition edge signal SE1_D is logical high and off when the delayed transition edge signal SE1_D is logical low. The operating principles of auto pre-emphasis circuit 901 shall be described with reference to the signal waveforms in FIG. 8, and the transition edge signal SE1 in this embodiment is generated according to the AND result of the data signal DATA and the inverse of the delayed data signal DATA_D (as shown in FIG. 8) for illustration. The data signal DATA has a state transition (rising edge) at time t0, and the transition edge signal SE1 is logical high and the delayed transition edge signal SE1_D is logical low during the time duration t0-t1, and thus the seventh switch 1011 is on, and the eighth switch 1012 and the ninth switch 1013 are off. Therefore, the first terminal of the capacitor 1020 is charged to the output voltage Vo at t1 (denoted as Vo(t1)), and the second terminal of the capacitor 1020 is charged to the ground voltage VSS, so that a voltage difference of Vo(t1) across the capacitor 1020 is stored; since the ninth switch 1013 is off, no pre-emphasis signal SP1 is output to the third current sinks 601 and the third current sources 603. During the time duration t1-t2, the transition edge signal SE1 is logical low and the delayed transition edge signal SE1_D is logical high, and the seventh switch 1011 is off, and the eighth switch 1012 and the ninth switch 1013 are on; therefore, by denoting the output voltage Vo at t2 as Vo(t2), the voltage at the positive input terminal of the third operational amplifier 1030 is Vo(t2)−Vo(t1), and thus the pre-emphasis signal SP1 is output as logical high to increase the second current when Vo(t2)−Vo(t1) is higher than the reference voltage Vref, and the pre-emphasis signal SP1 is output as logical low to decrease the second current when Vo(t2)−Vo(t1) is lower than the reference voltage Vref (note that Vref may be negative). After time t2, the seventh switch 1011, the eighth switch 1012, and the ninth switch 1013 are all off. Therefore, by designing the handshaking data pattern and the reference voltage Vref, Vo(t2) may be properly adjusted to be equal to Vo(t1)+Vref, wherein Vref may be negative, so as to overcome the RC delay and emphasize the transition edges. In another embodiment, the negative input terminal of the third operational amplifier 1030 may be coupled to the ground voltage VSS without the reference voltage source 1040, and an input offset voltage Vos (not shown) between the negative input terminal and the positive input terminal of the third operational amplifier 1030 may be created by designing the transistor sizes of an input differential pair of the third operational amplifier 1030, so that the input offset voltage Vos may have similar effects as the negative reference voltage Vref, but the invention is not limited thereto.

The invention provides a novel design of LVDS driving circuit. In conclusion, the proposed LVDS driving circuit has at least the following advantages compared with the prior art: (1) omitting the use of current sources and current sinks; (2) increasing the head room and widening the output range; (3) being suitable for applications of advanced processes with very low supply voltages; (4) enhancing the operating speed; (5) decreasing the manufacturing cost, and (6) enhanced signal quality for high data transmission rates.

Note that the above signal voltages, currents, resistances, and other element parameters are not limitations of the invention. A designer can adjust these parameters according to different requirements. The LVDS driving circuit of the invention is not limited to the configurations of FIGS. 1-10. The invention may merely include any one or more features of any one or more embodiments of FIGS. 1-10. In other words, not all of the features displayed in the figures should be implemented in the LVDS driving circuit of the invention. In addition, the first transistor M1, the second transistor M2, the third transistor M3, and the fourth transistor M4 of the LVDS driving circuit 100 may be implemented by other configurations such as all N-type transistors or all P-type transistors with the polarities of the signals and devices correspondingly changed without departing from the principles of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered exemplary only, with a true scope of the disclosed embodiments being indicated by the following claims and their equivalents.

What is claimed is:

1. An LVDS (Low Voltage Differential Signaling) driving circuit generating a differential signal at a first node and a second node according to a data signal, comprising:
   a first transistor, comprising a first terminal coupled to a supply voltage and a second terminal coupled to the first node, wherein the first transistor and a first driver form a first current mirror when the data signal is at a high logic level and do not form the first current mirror when the data signal is at a low logic level, wherein when the first current mirror is formed, a current passing through the first transistor when a XOR result of the data signal and a delayed data signal is logical high is higher than the current passing through the first transistor when the XOR result of the data signal and the delayed data signal is logical low;
   a second transistor, comprising a first terminal coupled to the supply voltage and a second terminal coupled to the second node, wherein the second transistor and a second driver form a second current mirror when the data signal is at the low logic level and do not form the second current mirror when the data signal is at the high logic level, wherein when the second current mirror is formed, a current passing through the second transistor when the XOR result of the data signal and the delayed data signal is logical high is higher than the current passing through the second transistor when the XOR result of the data signal and the delayed data signal is logical low;

a third transistor, comprising a first terminal coupled to a ground voltage and a second terminal coupled to the first node, wherein the third transistor and a third driver form a third current mirror when the data signal is at the low logic level and do not form the third current mirror when the data signal is at the high logic level, wherein when the third current mirror is formed, a current passing through the third transistor when the XOR result of the data signal and the delayed data signal is logical high is higher than the current passing through the third transistor when the XOR result of the data signal and the delayed data signal is logical low; and a fourth transistor, comprising a first terminal coupled to the ground voltage and a second terminal coupled to the second node, wherein the fourth transistor and a fourth driver form a fourth current mirror when the data signal is at the high logic level and do not form the fourth current mirror when the data signal is at the low logic level, wherein when the fourth current mirror is formed, a current passing through the fourth transistor when the XOR result of the data signal and the delayed data signal is logical high is higher than the current passing through the fourth transistor when the XOR result of the data signal and the delayed data signal is logical low, wherein the delayed data signal is generated by delaying the data signal with a time delay.

2. The LVDS driving circuit as claimed in claim 1, wherein each of the first driver and the second driver comprises:

a fifth transistor, wherein the fifth transistor has a control terminal coupled to a fourth node, a first terminal coupled to the supply voltage, and a second terminal coupled to the fourth node, wherein the fourth node has a first constant bias voltage;

a first current sink, drawing a first current from the fourth node;

a second current sink, drawing a second current from the fourth node when a XOR signal is logical high and not drawing the second current from the fourth node when the XOR signal is logical low, wherein the XOR signal is generated according to the XOR result of the data signal and the delayed data signal; and a first operational amplifier, wherein the first operational amplifier has a negative input terminal coupled to the fourth node, a positive input terminal coupled to a first driving node, and an output terminal coupled to the positive input terminal according to the data signal, wherein the first driving node of the first driver is coupled to a control terminal of the first transistor and the first driving node of the second driver is coupled to a control terminal of the second transistor.

3. The LVDS driving circuit as claimed in claim 2, wherein each of the first driver and the second driver further comprises:

a first switch, wherein the first switch has a first terminal coupled to the output terminal of the first operational amplifier, and a second terminal;

a second switch, wherein the second switch has a first terminal coupled to the second terminal of the first switch, and a second terminal coupled to the ground voltage;

a fifth switch, wherein the fifth switch has a first terminal coupled to the fourth node, and a second terminal coupled to the second current sink, wherein the fifth switch is on when the XOR signal is logical high and off when the XOR signal is logical low; and a sixth transistor, wherein the sixth transistor has a control terminal coupled to the second terminal of the first switch, a first terminal coupled to the supply voltage, and a second terminal coupled to the first driving node.

4. The LVDS driving circuit as claimed in claim 3, wherein in the first driver, the first switch is on and the second switch is off when the data signal is at the low logic level, and the first switch is off and the second switch is on when the data signal is at the high logic level, and wherein in the second driver, the first switch is on and the second switch is off when the data signal is at the high logic level, and the first switch is off and the second switch is on when the data signal is at the low logic level.

5. The LVDS driving circuit as claimed in claim 2, wherein the second current sink is a variable current sink, and the second current is adjusted according to a voltage difference between a voltage at the first node and a voltage at the second node.

6. The LVDS driving circuit as claimed in claim 5, further comprising:

a capacitor, having a first terminal receiving the voltage difference between the voltage at the first node and the voltage at the second node, and a second terminal;

a seventh switch, wherein the seventh switch has a first terminal coupled to the second terminal of the capacitor, and a second terminal coupled to the ground voltage, wherein the seventh switch is on when a transition edge signal is logical high and off when the transition edge signal is logical low;

an eighth switch, wherein the eighth switch has a first terminal coupled to the second terminal of the capacitor, and a second terminal, wherein the eighth switch is on when a delayed transition edge signal is logical high and off when the delayed transition edge signal is logical low, wherein the delayed transition edge signal is generated by delaying the transition edge signal by the time delay; and a third operational amplifier, wherein the third operational amplifier has a positive input terminal coupled to the second terminal of the eighth switch, a negative input terminal coupled to the ground voltage, and an output terminal coupled to the second current source according to the delayed transition edge signal.

7. The LVDS driving circuit as claimed in claim 6, wherein the negative input terminal of the third operational amplifier is coupled to the ground voltage via a reference voltage source.

8. The LVDS driving circuit as claimed in claim 6, wherein the third operational amplifier has an input offset voltage between the negative input terminal and the positive input terminal.

9. The LVDS driving circuit as claimed in claim 6, wherein the transition edge signal is generated according to an AND result of the data signal and an inverse of the delayed data signal.

10. The LVDS driving circuit as claimed in claim 6, wherein the transition edge signal is generated according to an AND result of the delayed data signal and an inverse of the data signal.

11. The LVDS driving circuit as claimed in claim 1, wherein each of the third driver and the fourth driver comprises:

a seventh transistor, wherein the seventh transistor has a control terminal coupled to a sixth node, a first terminal coupled to the ground voltage, and a second terminal coupled to the sixth node, wherein the sixth node has a second constant bias voltage;

a first current source, supplying a first current to the sixth node;

a second current source, supplying a second current to the sixth node when a XOR signal is logical high and not supplying the second current to the sixth node when the XOR signal is logical low, wherein the XOR signal is generated according to the XOR result of the data signal and the delayed data signal; and a second operational amplifier, wherein the second operational amplifier has a negative input terminal coupled to the sixth node, a positive input terminal coupled to a second driving node, and an output terminal coupled to the positive input terminal according to the data signal, wherein the second driving node of the third driver is coupled to a control terminal of the third transistor and the second driving node of the fourth driver is coupled to a control terminal of the fourth transistor.

12. The LVDS driving circuit as claimed in claim 11, wherein each of the third driver and the fourth driver further comprises:

a fourth switch, wherein the fourth switch has a first terminal coupled to the output terminal of the second operational amplifier, and a second terminal;

a third switch, wherein the third switch has a first terminal coupled to the second terminal of the fourth switch, and a second terminal coupled to the supply voltage;

a sixth switch, wherein the sixth switch has a first terminal coupled to the sixth node, and a second terminal coupled to the second current source, wherein the sixth switch is on when the XOR signal is logical high and off when the XOR signal is logical low; and an eighth transistor, wherein the eighth transistor has a control terminal coupled to the second terminal of the fourth switch, a first terminal coupled to the ground voltage, and a second terminal coupled to the second driving node.

13. The LVDS driving circuit as claimed in claim 12, wherein in the third driver, the third switch is on and the fourth switch is off when the data signal is at the high logic level, and the third switch is off and the fourth switch is on when the data signal is at the low logic level, and wherein in the fourth driver, the third switch is on and the fourth switch is off when the data signal is at the low logic level, and the third switch is off and the fourth switch is on when the data signal is at the high logic level.

14. The LVDS driving circuit as claimed in claim 11, wherein the second current source is a variable current source, and the second current is adjusted according to a voltage difference between a voltage at the first node and a voltage at the second node.

15. The LVDS driving circuit as claimed in claim 14, further comprising:

a capacitor, having a first terminal receiving the voltage difference between the voltage at the first node and the voltage at the second node, and a second terminal;

a seventh switch, wherein the seventh switch has a first terminal coupled to the second terminal of the capacitor, and a second terminal coupled to the ground voltage, wherein the seventh switch is on when a transition edge signal is logical high and off when the transition edge signal is logical low;

an eighth switch, wherein the eighth switch has a first terminal coupled to the second terminal of the capacitor, and a second terminal, wherein the eighth switch is on when a delayed transition edge signal is logical high and off when the delayed transition edge signal is logical low, wherein the delayed transition edge signal is generated by delaying the transition edge signal by the time delay; and a third operational amplifier, wherein the third operational amplifier has a positive input terminal coupled to the second terminal of the eighth switch, a negative input terminal coupled to the ground voltage, and an output terminal coupled to the second current source according to the delayed transition edge signal.

16. The LVDS driving circuit as claimed in claim 15, wherein the negative input terminal of the third operational amplifier is coupled to the ground voltage via a reference voltage source.

17. The LVDS driving circuit as claimed in claim 15, wherein the third operational amplifier has an input offset voltage between the negative input terminal and the positive input terminal.

18. The LVDS driving circuit as claimed in claim 15, wherein the transition edge signal is generated according to an AND result of the data signal and an inverse of the delayed data signal.

19. The LVDS driving circuit as claimed in claim 15, wherein the transition edge signal is generated according to an AND result of the delayed data signal and an inverse of the data signal.

* * * * *